United States Patent
Takeguchi et al.

(10) Patent No.: US 9,042,118 B2
(45) Date of Patent: May 26, 2015

(54) TELEVISION RECEIVER AND ELECTRONIC APPARATUS

(71) Applicants: Koichiro Takeguchi, Tokyo (JP); Shigeo Hayashi, Tokyo (JP)

(72) Inventors: Koichiro Takeguchi, Tokyo (JP); Shigeo Hayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 13/725,488

(22) Filed: Dec. 21, 2012

(65) Prior Publication Data

US 2013/0114214 A1 May 9, 2013

Related U.S. Application Data

(63) Continuation of application No. 13/287,812, filed on Nov. 2, 2011, now abandoned.

(30) Foreign Application Priority Data

Mar. 16, 2011 (JP) .................................. 2011-058584

(51) Int. Cl.
*H05K 7/02* (2006.01)
*H05K 7/04* (2006.01)
*H04N 5/64* (2006.01)
*H05K 3/30* (2006.01)

(52) U.S. Cl.
CPC .. *H05K 7/02* (2013.01); *H04N 5/64* (2013.01); *H05K 3/301* (2013.01); *H05K 2201/10409* (2013.01); *H05K 2201/2009* (2013.01)

(58) Field of Classification Search
USPC .......................................... 361/807, 809, 810
See application file for complete search history.

(56) References Cited

U.S. PATENT DOCUMENTS

| | | | |
|---|---|---|---|
| 5,923,530 A * | 7/1999 | Murayama et al. | 361/679.09 |
| 6,011,741 A | 1/2000 | Wallace et al. | |
| 7,595,992 B2 * | 9/2009 | Koga | 361/719 |
| 7,813,138 B2 * | 10/2010 | Takeguchi et al. | 361/749 |
| 8,004,859 B2 * | 8/2011 | Morita | 361/807 |

(Continued)

FOREIGN PATENT DOCUMENTS

| | | |
|---|---|---|
| JP | 08-228059 | 9/1996 |
| JP | 2006-216944 | 8/2006 |

(Continued)

OTHER PUBLICATIONS

Japanese Patent Application No. 2011-058584, Notice of Rejection, mailed Feb. 21, 2012, (with English Translation).

(Continued)

*Primary Examiner* — Hung S Bui
(74) *Attorney, Agent, or Firm* — Blakely Sokoloff Taylor & Zafman LLP

(57) ABSTRACT

According to one embodiment, a television receiver includes: a housing; a circuit board arranged in the housing; an electronic component mounted on the circuit board; a reinforcing member comprising a first surface in contact with the circuit board, and a second surface located on an opposite side of the first surface and exposed to an inside of the housing; a component contained in the housing, the component comprising a first supported area located at a distance from a surface of the circuit board; and a support member configured to support the component, the support member comprising a first end portion fixed to the first supported area of the component, and a second end portion fixed to the second surface of the reinforcing member.

5 Claims, 20 Drawing Sheets

(56) References Cited

U.S. PATENT DOCUMENTS

| | | | |
|---|---|---|---|
| 8,767,390 B2 * | 7/2014 | Takeguchi et al. | 361/679.47 |
| 2006/0171129 A1 | 8/2006 | Berto et al. | |
| 2007/0063324 A1 | 3/2007 | Mishiro et al. | |
| 2010/0300739 A1 | 12/2010 | Suzuki | |
| 2012/0236214 A1 | 9/2012 | Takeguchi et al. | |

FOREIGN PATENT DOCUMENTS

| | | |
|---|---|---|
| JP | 2007-088293 | 4/2007 |
| JP | 2008-191395 | 8/2008 |
| JP | 2010-093310 | 4/2010 |
| JP | 2010-177513 | 8/2010 |
| JP | 2010-283017 | 12/2010 |

OTHER PUBLICATIONS

Japanese Patent Application No. 2011-058584, Notice of Rejection, mailed May 15, 2012, (with English Translation).

U.S. Appl. No. 13/287,812, Non-Final Office Action, mailed Sep. 24, 2012.

* cited by examiner

FIG.1
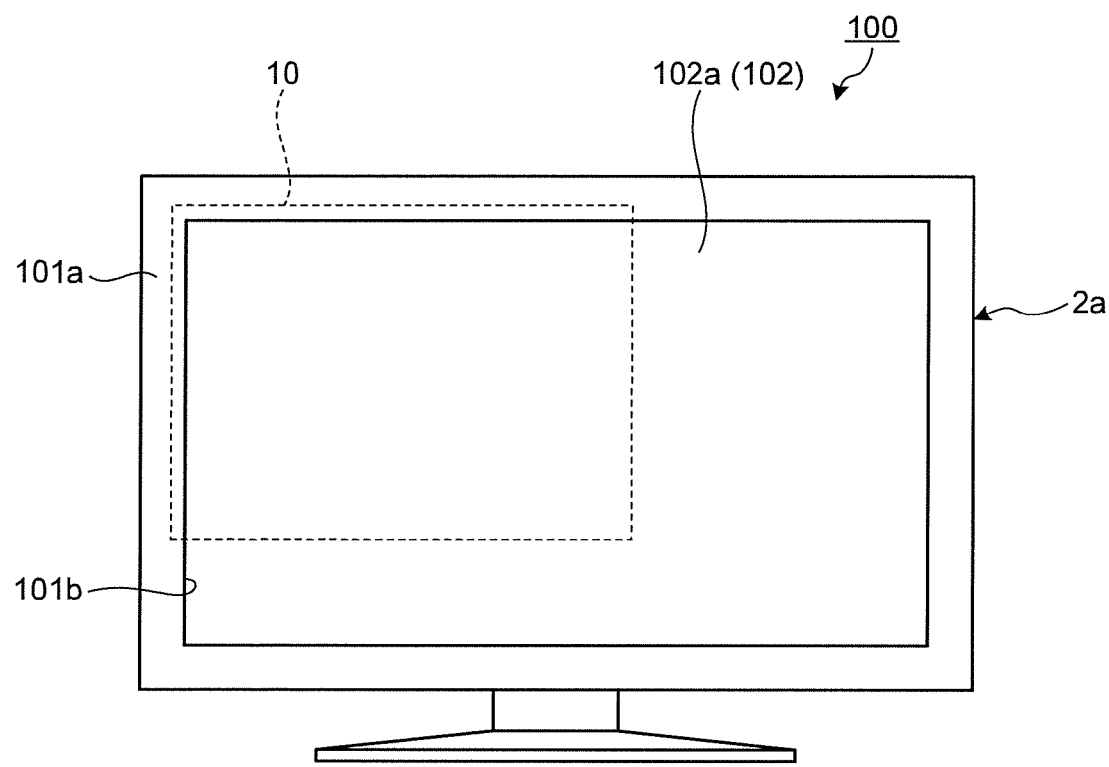
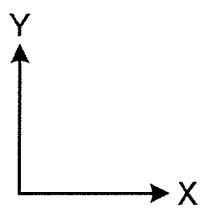

TELEVISION RECEIVER AND ELECTRONIC APPARATUS

CROSS-REFERENCE TO RELATED APPLICATIONS

This application is a continuation application based on U.S. application Ser. No. 13/287,812, now abandoned, which is based upon and claims the benefit of priority from Japanese Patent Application No. 2011-058584, filed Mar. 16, 2011, the entire contents of which are incorporated herein by reference.

FIELD

Embodiments described herein relate generally to a television receiver and an electronic apparatus.

BACKGROUND

There have been electronic apparatuses each having a reinforcing plate provided along a circuit board.

Those electronic apparatuses are expected to have higher efficiencies in the mounting of components (modules or devices) on circuit boards.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 1 is an exemplary front view of a television receiver according to a first embodiment;

DETAILED DESCRIPTION

Figure 2:
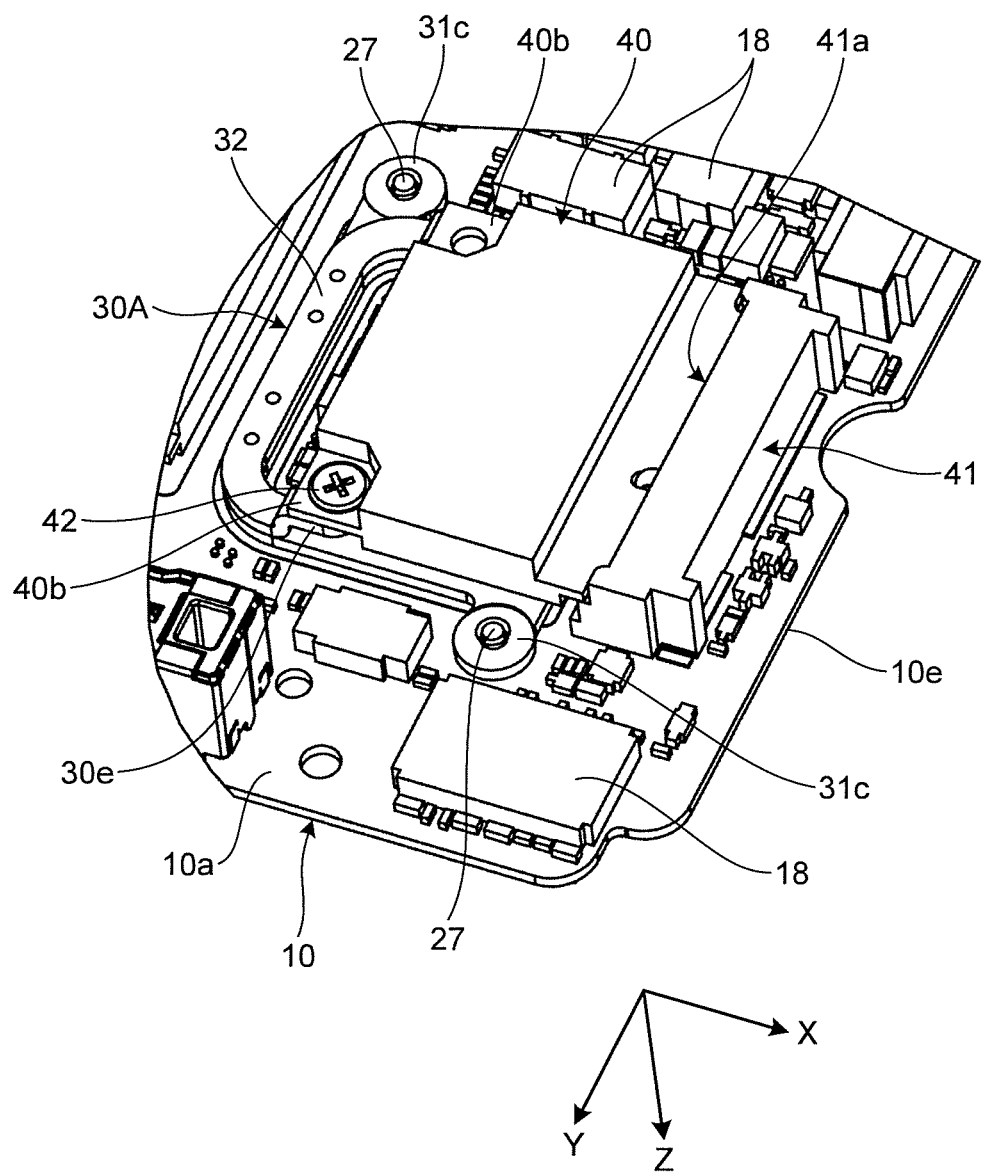
FIG. 2 is an exemplary perspective view illustrating part of a circuit board included in the television receiver in the first embodiment.

In general, according to one embodiment, a television receiver comprises a housing, a circuit board, an electronic component, a reinforcing member, a component and a support member. The circuit board is arranged in the housing. The electronic component is mounted on the circuit board. The reinforcing member comprises a first surface in contact with the circuit board, and a second surface located on an opposite side of the first surface and exposed to an inside of the housing. The component is contained in the housing. The component comprises a first supported area located at a distance from a surface of the circuit board. The support member is configured to support the component. The support member comprises a first end portion fixed to the first supported area of the component, and a second end portion fixed to the second surface of the reinforcing member.

According to another embodiment, a television receiver comprises a housing, a circuit board, an electronic component, a component, and a reinforcing member. The circuit board is arranged in the housing. The electronic component is mounted on the circuit board. The component is contained in the housing. The component comprises a first supported area located at a distance from a surface of the circuit board. The reinforcing member comprises a first surface in contact with the circuit board, a second surface located on an opposite side of the first surface and exposed to an inside of the housing, and a contact portion protruding from the second surface and in contact with the first supported area.

According to still another embodiment, an electronic apparatus comprises a housing, a circuit board, a first module, a second module, and a reinforcing member. The circuit board is arranged in the housing. The circuit board comprises a first surface and a second surface located on an opposite side of the first surface. The first module is provided at a side of the first surface. The second module is provided at a side of the second surface. The reinforcing member is configured to reinforce the circuit board and support or fix the second module, the reinforcing member being provided at the side of the second surface and provided at an opposite position of a position where the first module is located with respect to the circuit board.

According to still another embodiment, an electronic apparatus comprises a housing, a circuit board, a first module, a second module, and a member. The circuit board is arranged in the housing. The circuit board comprises a first surface and a second surface located on an opposite side of the first surface. The first module is provided at a side of the first surface. The second module is provided at a side of the second surface. The member comprises an inner portion located at or inside a periphery of an opposite area of an area where the first module is located with respect to the circuit board, and an outer portion located outside the periphery of the opposite area. The second module is supported or fixed with the outer portion.

The following is a detailed description of embodiments. It should be noted that the following embodiments and modifications thereof contain like components. In the following, those like components are denoted by like reference numerals, and such components will be described only once. Also, in the respective drawings illustrating the following embodiments, orientations are defined for convenience. An X-direction is a width direction of a housing 2a having a structure according to the embodiments, a Y-direction is a height direction (a depth direction in the second embodiment), and a Z-direction is a thickness direction. The X-direction, the Y-direction, and the Z-direction are perpendicular to one another.

First Embodiment

FIG. 1 is a front view of a television receiver (a television set, a video image display apparatus) 100 as an electronic apparatus according to this embodiment. As illustrated in FIG. 1, the television receiver 100 externally appears to have a rectangular shape that is long in a horizontal direction (the X-direction) and is short in a vertical direction (the Y-direction) in the front view seen from the front (or in a plan view of the front surface). The television receiver 100 comprises: a housing 2a; a display panel 102 (such as a liquid crystal display (LCD) or an organic electro-luminescent display (OELD)) as a display module (a display device, a module) having a display screen 102a exposed forward through an opening 101b formed on a front surface 101a of the housing 2a; and a circuit board 10 on which devices (components, electronic components, or modules) 18 (see FIG. 2 and others) and others are mounted. The display panel 102 and the circuit board 10 are secured to the housing 2a with screws or the like (not illustrated).

The display panel 102 is designed to have a thin, flat parallelepiped shape that extends in the depth direction (the direction perpendicular to the plane of FIG. 1, or the Z-direction, as illustrated in FIG. 2 and others). The display panel 102 receives a video signal from a video signal processing circuit included in a control circuit (neither circuit illustrated in the drawing) formed with the devices 18 (see FIG. 2 and others) mounted on the circuit board 10, and causes the display screen 102a which is located on the front surface side of the display panel 102 to display an image such as a still image or a video image. The control circuit of an electronic apparatus 1 as a television set comprises not only the video signal processing circuit but also a tuner module, a High-Definition Multimedia Interface (HDMI) signal processor, an Audio Video (AV) input terminal, a remote-controller signal receiver, a controller, a selector, an on-screen display Interface, a storage (such as a Read Only Memory (ROM), a Random Access Memory (RAM), or a Hard Disk Drive (HDD)), and an audio signal processing circuit (any of the components not illustrated in the drawing). The circuit board 10 is housed behind the display panel 102 in the housing 2a. The television receiver 100 also comprises an amplifier and a speaker for audio outputs (neither illustrated in the drawing).

FIG. 2 is a perspective view of a portion of the circuit board 10 in which a reinforcing plate 30A is provided at a back side of an area where a module (not illustrated in the drawing) is mounted. As illustrated in FIG. 2, the reinforcing plate 30A is covered with a wireless local area network (LAN) module 40. The wireless LAN module 40 is connected to a connector 41. The wireless LAN module 40 is an example of a contained component (a module or component).

Figure 3:
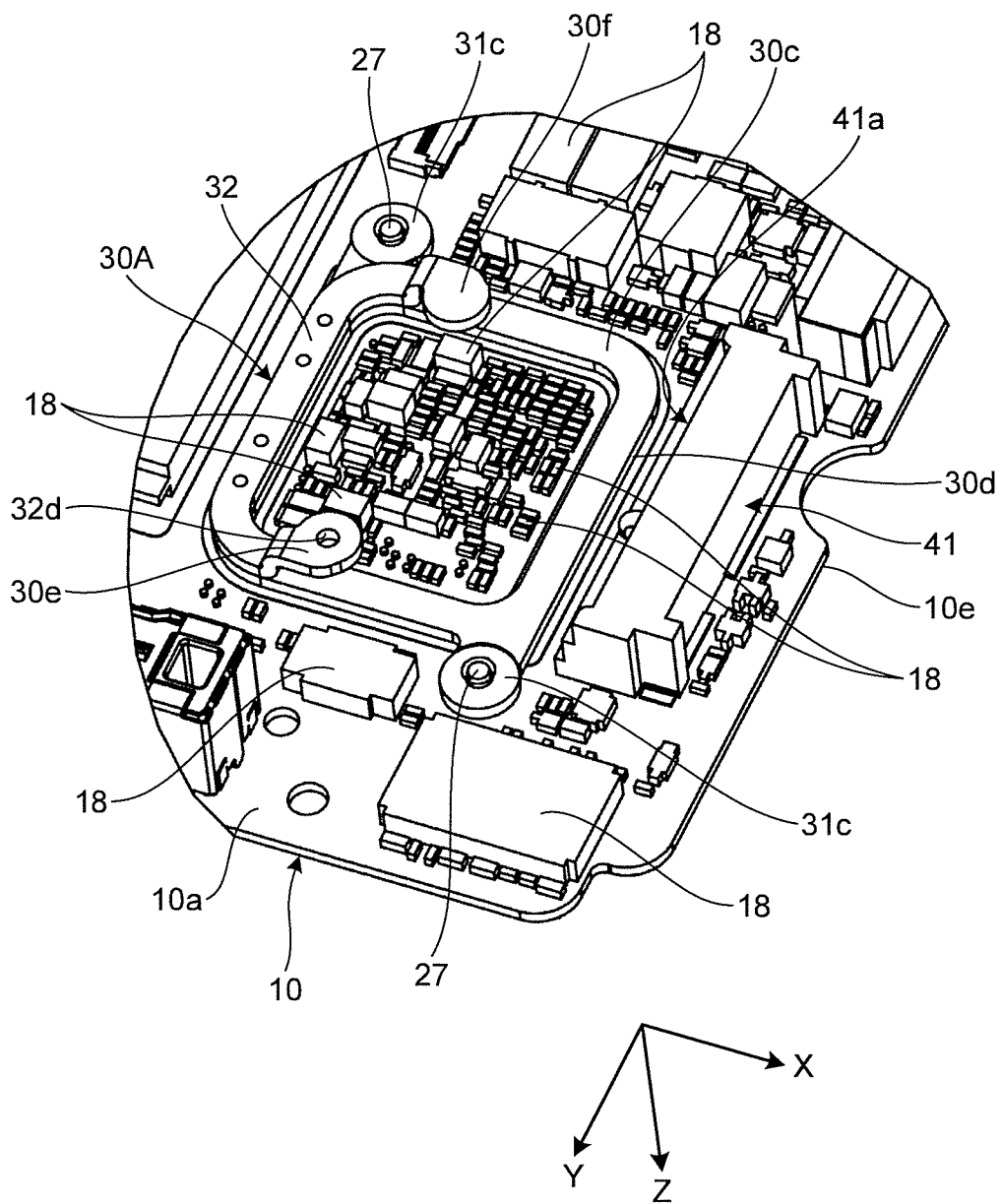
FIG. 3 is an exemplary perspective view illustrating a situation where a wireless LAN module is removed from the structure illustrated in FIG. 2 in the first embodiment.

FIG. 3 is a perspective view illustrating a situation where the wireless LAN module 40 is detached from the structure illustrated in FIG. 2, or a situation seen before the wireless LAN module 40 is attached to the structure. As illustrated in FIG. 3, relatively small devices (components) 18 (with small heights) are mounted at locations inside the reinforcing plate 30A on a surface 10a of the circuit board 10. The reinforcing plate 30A is located in an area in which the devices 18 are not mounted. Fixtures 27 are screwed to protrusions 31c, so that the reinforcing plate 30A is secured to the circuit board 10. The device 18 provided in the area in which the reinforcing plate 30A is not mounted is an example of a third module.

Figure 4:
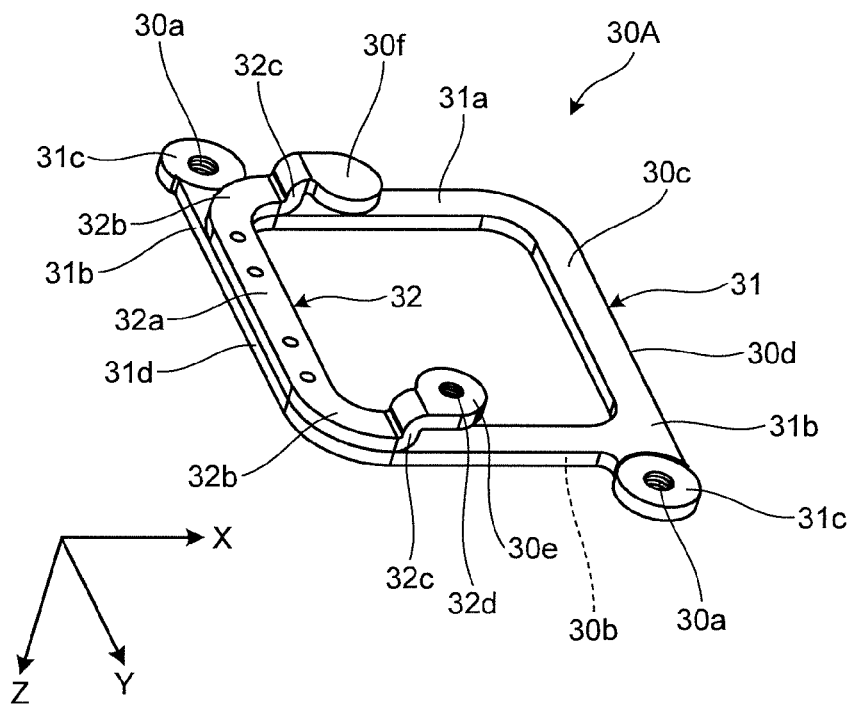
FIG. 4 is an exemplary perspective view illustrating a reinforcing member included in the television receiver in the first embodiment.

FIG. 4 is a perspective view of the reinforcing plate 30A. The reinforcing plate 30A is formed by integrating a first member 31 and a second member 32. The first member 31 comprises a ring-like portion 31a, corner portions 31b, the protrusions 31c, and an end portion 31d. The ring-like portion 31a is designed to have a rectangular ring-like shape. The corner portions 31b are positioned at diagonal corners of the ring-like portion 31a. The protrusions 31c protrude from the corner portions 31b outwardly with respect to the ring-like portion 31a, and each of the protrusions 31c is designed to have a disk-like shape. Female screw holes (fixing portions, screw portions) 30a are formed in the protrusions 31c. The end portion 31d is an example of a side portion of the ring-like portion 31a having the rectangular ring-like shape.

The second member 32 comprises a base 32a, end portions 32b, protrusions 32c, and receiving portions 30e and 30f. The base 32a is placed on the end portion 31d serving as the side portion of the ring-like portion 31a, and extends along the end portion 31d. The base 32a is bent at both end portions 32b to be formed into a U-shape. The protrusions 32c protrude (stand) at both end portions 32b and extend in such a direction as to move gradually away from the first member 31. The receiving portions 30e and 30f are located at the top ends of the protrusions 32c, and are designed to have disk-like shapes that extend along (parallel to) the first member 31. The receiving portion 30e has a female screw hole 32d formed therein. In this embodiment, the second member 32 is an example of a support member, and the base 32a is an example of a second end portion.

The first member 31 and the second member 32 are integrated (joined) by welding (or spot welding or the like), for example. In this embodiment, the end portion 31d of the first member 31 and the base 32a are spot-welded at several points (four points, for example).

The reinforcing plate 30A is arranged along the surface 10a or a surface 10b of the circuit board 10, or preferably, is located in contact with the surface 10a or the surface 10b. In this embodiment, the reinforcing plate 30A is located at the side of the surface 10a of the circuit board 10 and has a first surface 30b (see FIG. 4 and others) that is located in contact with the surface 10a, and a second surface 30c that is located on the opposite side of the first surface 30b and is exposed to the inside of the housing 2a. In a case where the reinforcing plate 30A is located on the side of the surface 10b of the circuit board 10, the first surface 30b is located in contact with the surface 10b of the circuit board 10, and the second surface 30c is exposed to the inside of the housing 2a.

Figure 5:
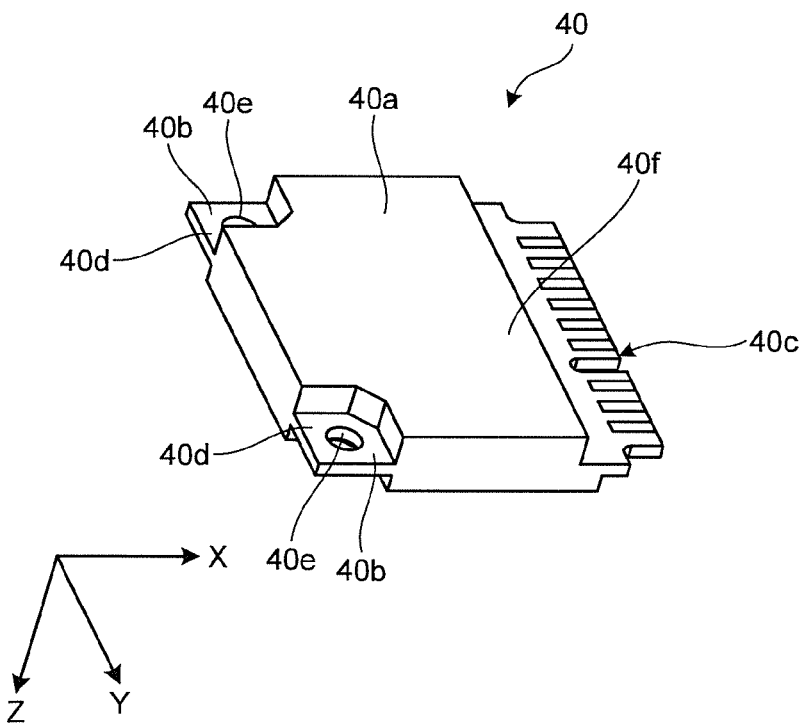
FIG. 5 is an exemplary perspective view illustrating the wireless LAN module included in the television receiver in the first embodiment.

FIG. 5 is a perspective view of the wireless LAN module 40. The wireless LAN module 40 externally appears to have a rectangular shape (or a square shape) when viewed from the thickness direction (the Z-direction). The wireless LAN module 40 comprises a body (housing) 40a, flanges 40b, and connector portions 40c. The body 40a is designed to have a flat parallelepiped shape. The flanges 40b are formed as rectangular, relatively thin plate-like portions at two corner portions 40d serving as the two end portions of a side of the rectangle. Through holes 40e are formed at the respective flanges 40b. The connector portions 40c protrude outwardly from an end portion (a side portion) 40f located on the opposite side of the two corner portions 40d, and have substantially the same widths along the end portion 40f.

As illustrated in FIGS. 2 and 3 and others, the connector 41 is designed to have a thin, long rectangular shape. The connector 41 is arranged along an end portion 10e of the circuit board 10, and is located between the end portion 10e and an end portion 30d of the reinforcing plate 30A. The end portion 10e of the circuit board 10, the connector 41, and the end portion 30d of the reinforcing plate 30A are provided along (parallel to) one another. The connector 41 is fixed onto the surface 10a by soldering, for example.

After inserting the connector portions 40c of the wireless LAN module 40 into a connection portion 41a of the connector 41, a worker places the flanges 40b of the wireless LAN module 40 onto the receiving portions 30e and 30f of the reinforcing plate 30A. The worker then screws a fixture 42 such as a screw penetrating through the through hole 40e of one of the flanges 40b into the female screw hole 32d of the receiving portion 30e of the reinforcing plate 30A. The connection portion 41a allows the connector portions 40c to move in such a direction (toward the left in FIGS. 2 and 3) as to open the connection portion 41a, and to rotate in such a direction that the flanges 40b pop up. The connection portion 41a prohibits the connector portions 40c from moving and rotating in any other directions. Accordingly, by securing one of the flanges 40b to the receiving portion 30e with the fixture 42, the wireless LAN module 40 can be secured in the situation illustrated in FIG. 2. In view of this, the receiving portion 30e is an example of a securing portion (a fixing portion). Meanwhile, the other one of the flanges 40b is placed on the receiving portion 30f, but is not fixed thereto. In view of this, the receiving portion 30f is an example of a placement portion (a support member) supporting the other one of the flanges 40b. The receiving portion 30e is an example of a first end portion, and the receiving portion 30f is an example of a third end portion.

As described above, the wireless LAN module 40 is positioned at a distance from the surface 10a of the circuit board 10 and is located above the surface 10a. Also, the wireless LAN module 40 is arranged along (parallel to) the surface 10a. Further, the wireless LAN module 40 is supported by the reinforcing plate 30A and the connector 41 at both ends.

In this embodiment having the above described structure, the reinforcing plate 30A is used for supporting or securing the wireless LAN module 40 serving as an example of a contained component (a module or component). Therefore, the number of components can be made smaller than that in a case where components for supporting or securing the wireless LAN module 40 are separately provided on the circuit board 10, for example. Also, since the number of components provided on the circuit board 10 is reduced, interconnects can be more easily arranged on the circuit board 10, for example.

In this embodiment, the reinforcing plate 30A comprises the second member 32 for a support member. Accordingly, the reinforcing plate 30A can be formed as a component with a higher rigidity. Also, the reinforcing plate 30A can be more easily manufactured. Also, by taking advantage of a conventional reinforcing plate not having a support member, the reinforcing plate 30A having the function to support or secure a contained component can be more efficiently manufactured. Further, by varying the specific properties (such as the material and the bending rigidity) between the first member 31 and the second member 32, the reinforcing plate 30A can more easily realize the two functions (the functions to reinforce the circuit board 10 and to support or secure the contained component). It should be noted that the first member 31 and the second member 32 can be joined by a technique other than welding, (such as screwing, adhesion, bonding, or engaging). The first member 31 or the second member 32 may be made of a material such as a synthetic resin material, instead of a metal material.

Second Embodiment

Figure 6:
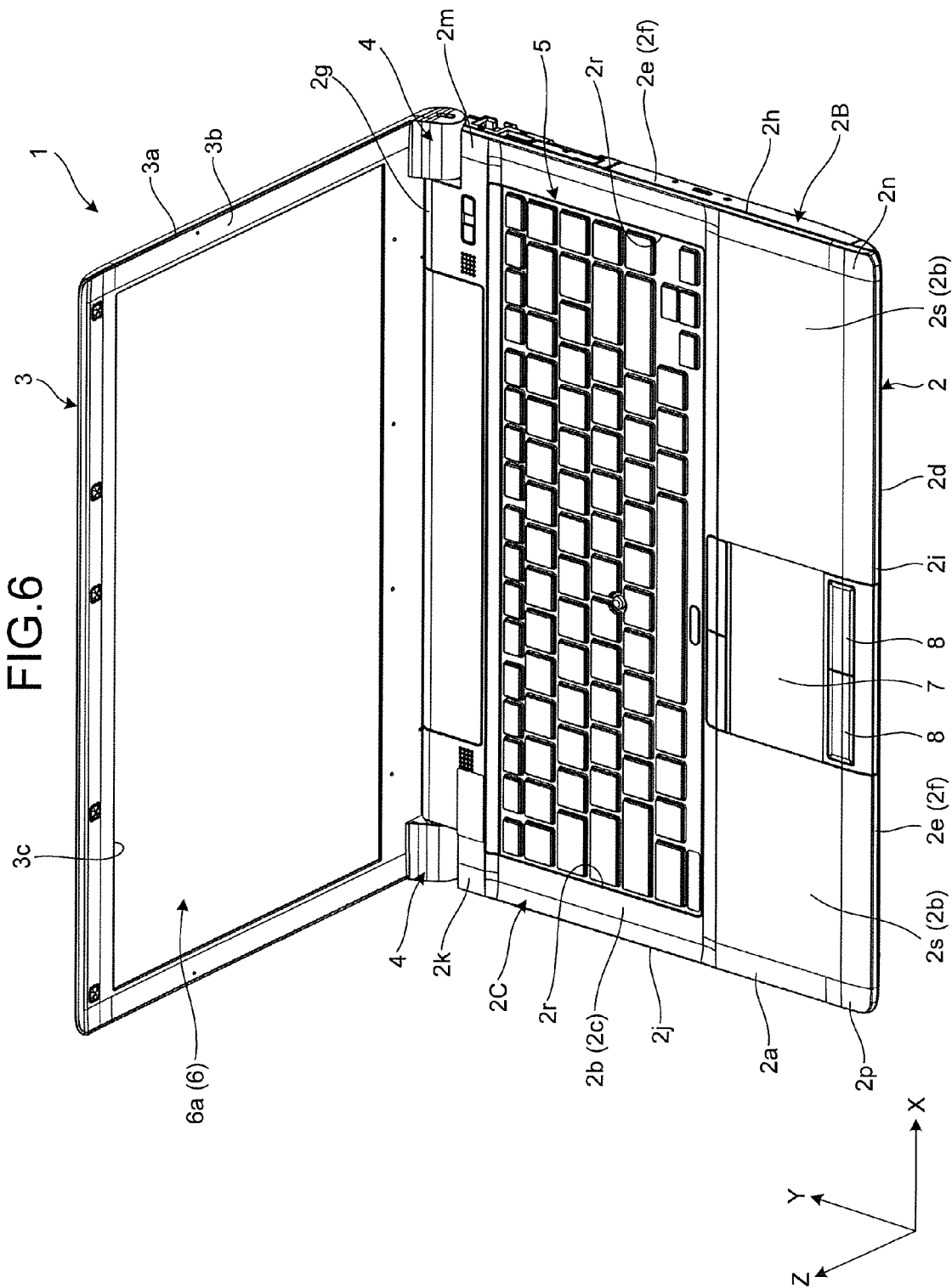
FIG. 6 is an exemplary perspective view of an electronic apparatus in an opened state according to a second embodiment.

FIG. 6 is a perspective view of an electronic apparatus 1 according to this embodiment in an opened state. As illustrated in FIG. 6, the electronic apparatus 1 is formed as a so-called notebook-size personal computer. The electronic apparatus 1 comprises a rectangular, flat first unit 2, and a rectangular, flat second unit 3. The first unit 2 and the second unit 3 are connected by hinge mechanisms 4 in such a manner that the first unit 2 and the second unit 3 can rotatively move with respect to each other. Accordingly, the two modules are switched between the opened state illustrated in FIG. 6 and a folded state not illustrated in FIG. 6.

A keyboard 5, a pointing device 7, click buttons 8, and the like serving as input operation modules (modules, input devices, operation modules, or input modules) are provided in the first unit 2 in such a manner that those components are exposed through an upper surface (a top surface, a surface) 2b serving as an external surface (a surface) of a housing 2a. A display panel 6 (such as a LCD or an GELD) serving as a display module (a module, a display device, or an output module) is provided in the second unit 3 in such a manner that a display screen 6a is exposed through an opening 3c on the side of a front surface (a surface) 3b serving as an external surface (a surface) of a housing 3a. In the opened state, the keyboard 5, the display panel 6, and the like are exposed, and can be used by a user. In the folded state, on the other hand, the upper surface 2b and the front surface 3b surface each other and are located very close to each other, and the keyboard 5, the display panel 6, the pointing device 7, the click buttons 8, and the like are hidden inside the housings 2a and 3a. The housing 2a is an example of a first housing, and the housing 3a is an example of a second housing.

The housing 2a of the first unit 2 comprises a rectangular plate-like upper wall 2c forming the upper surface 2b, a rectangular plate-like lower wall 2d forming a lower surface (a bottom surface, a surface, not illustrated), and sidewalls (surrounding walls, vertical walls, or standing walls) 2f forming side surfaces (surrounding surfaces, surfaces) 2e. The lower wall 2d is located on the opposite side of the upper wall 2c, and is at a distance from the upper wall 2c. The sidewalls 2f extend in a direction (a vertical direction) perpendicular to the upper wall 2c and the lower wall 2d, and are provided to bridge the upper wall 2c and the lower wall 2d. The upper wall 2c, the lower wall 2d, and the sidewalls 2f are an example of walls.

The housing 2a comprises an upper portion (an upper housing, a component, or a cover) 2C and a lower portion (a lower housing, a component, or a bottom) 2B. The housing 2a is formed by integrating the upper portion 2C and the lower portion 2B. The upper portion 2C comprises the upper wall 2c, and may comprise part of the sidewalls 2f. Also, the lower portion 2B comprises the lower wall 2d, and may comprise part of the sidewalls 2f.

The housing 2a also comprises four end portions (side portions) 2g through 2j, and four corner portions 2k, 2m, 2n, and 2p. The end portion 2g is an example of a back end portion. The end portion 2i is an example of a front end portion located on the opposite side of the back end portion. The end portion 2h is an example of a right end portion (a side end portion). The end portion 2j is an example of a left end portion (a side end portion) located on the opposite side of the right end portion. A rectangular concavity 2r that is long in the width direction (the X-direction) is formed on the upper surface 2b. The keyboard 5 is housed (placed) in the concavity 2r. The concavity 2r is an example of a housing or a placement portion for the keyboard 5.

Palm rests 2s are formed in areas located on the front side of the concavity 2r of the upper wall 2c. The palm rests 2s form the relatively flat upper surface 2b. Since the concavity 2r is concave, the upper surface of the keyboard 5 housed (placed) in the concavity 2r can be set almost the same height as the upper surface 2b of each of the palm rests 2s.

Figure 7:
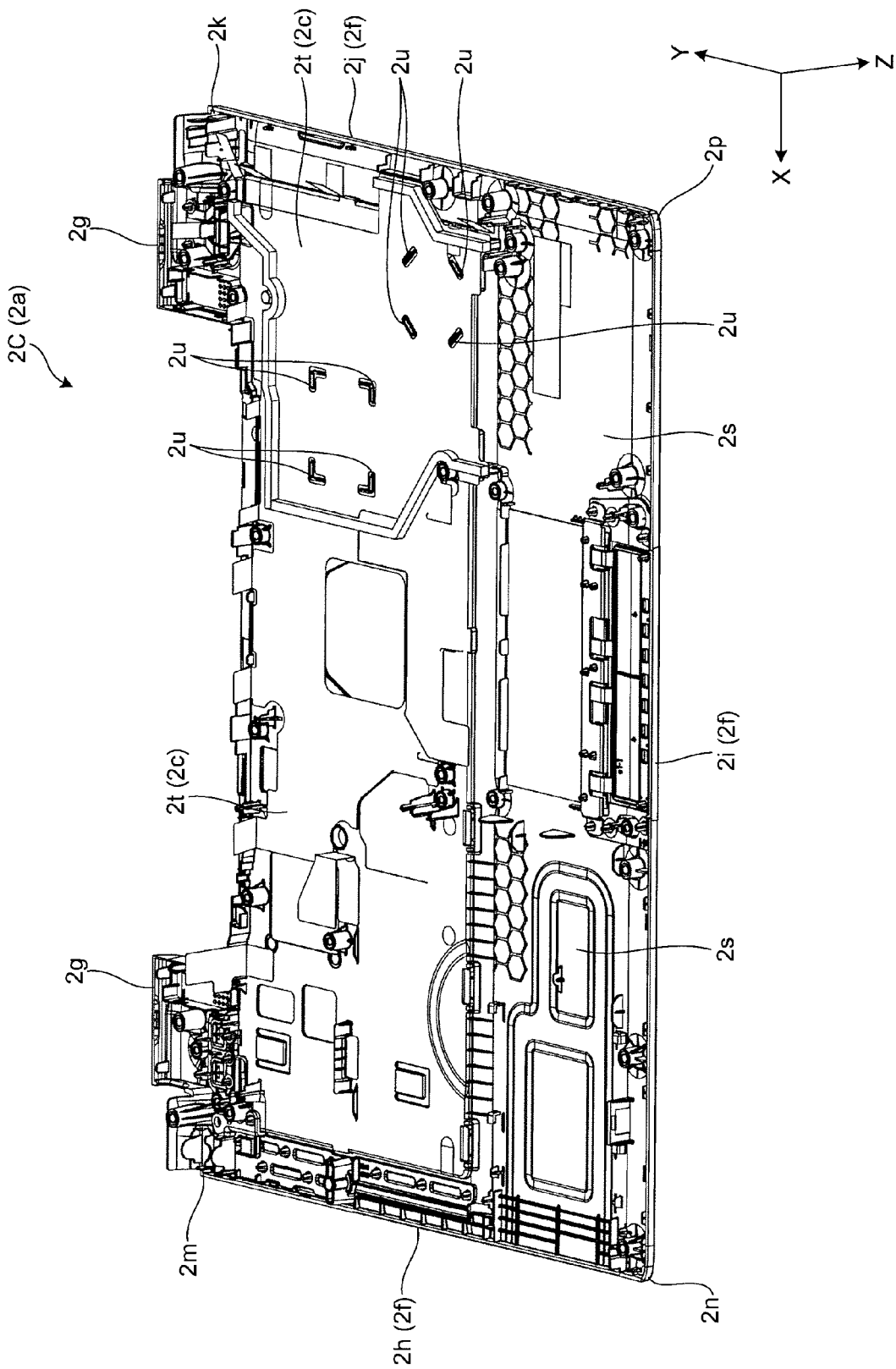
FIG. 7 is an exemplary perspective view illustrating an inside of an upper portion in a housing of a first unit of the electronic apparatus in the second embodiment.

FIG. 7 is a perspective view of the upper portion 2C of the housing 2a viewed from the inside (a back side or a back surface 2t) of the housing 2a. As illustrated in FIG. 7, protrusions 2u are formed on the back surface 2t of the upper wall 2c.

Figure 8:
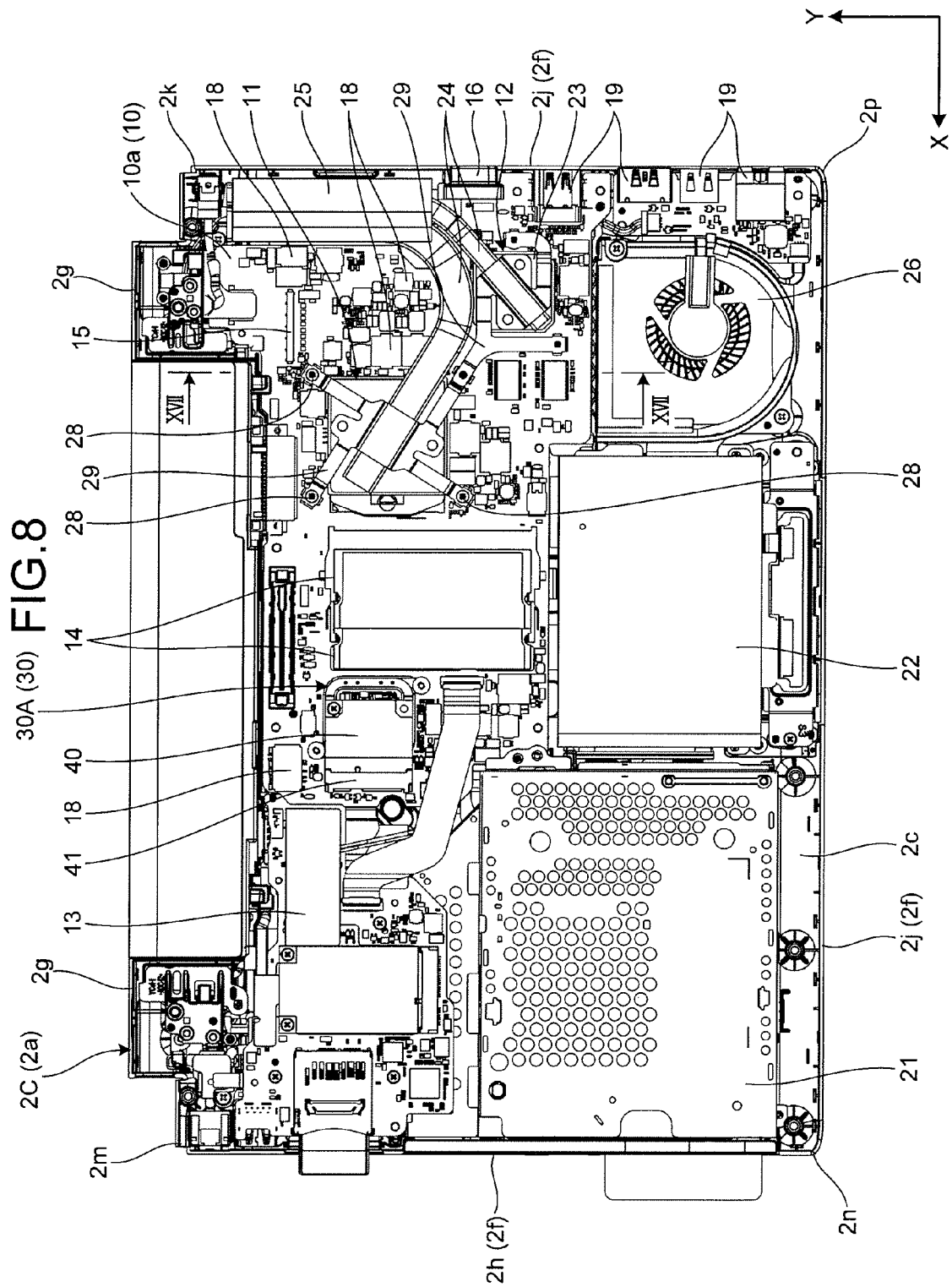
FIG. 8 is an exemplary plan view illustrating an inside of a housing, with a lower portion of the first unit being removed from the electronic apparatus in the second embodiment.

FIG. 8 is a plan view of the inside of the housing 2a, with the lower portion 2B of the first unit 2 being removed. The housing 2a of the first unit 2 houses a circuit board (a board, a printed wiring board, or a control board) 10, an optical disk device (ODD) 21, a storage device 22, a heat sink 23, heat pipes 24, a radiator plate 25, a cooling fan 26, and the like. The circuit board 10 is a main board, for example. In this embodiment, one end (not illustrated) of each of the hinge mechanisms 4 is attached to the upper portion 2C onto which the above described components (such as the circuit board 10, the ODD 21, the storage device 22, the heat sink 23, the heat pipes 24, the radiator plate 25, and the cooling fan 26) are attached. At this point, the other end (not illustrated) of each of the hinge mechanisms 4 is already attached to the assembled second unit 3. After that, the lower portion 2B is attached to the upper portion 2C.

Figure 9:
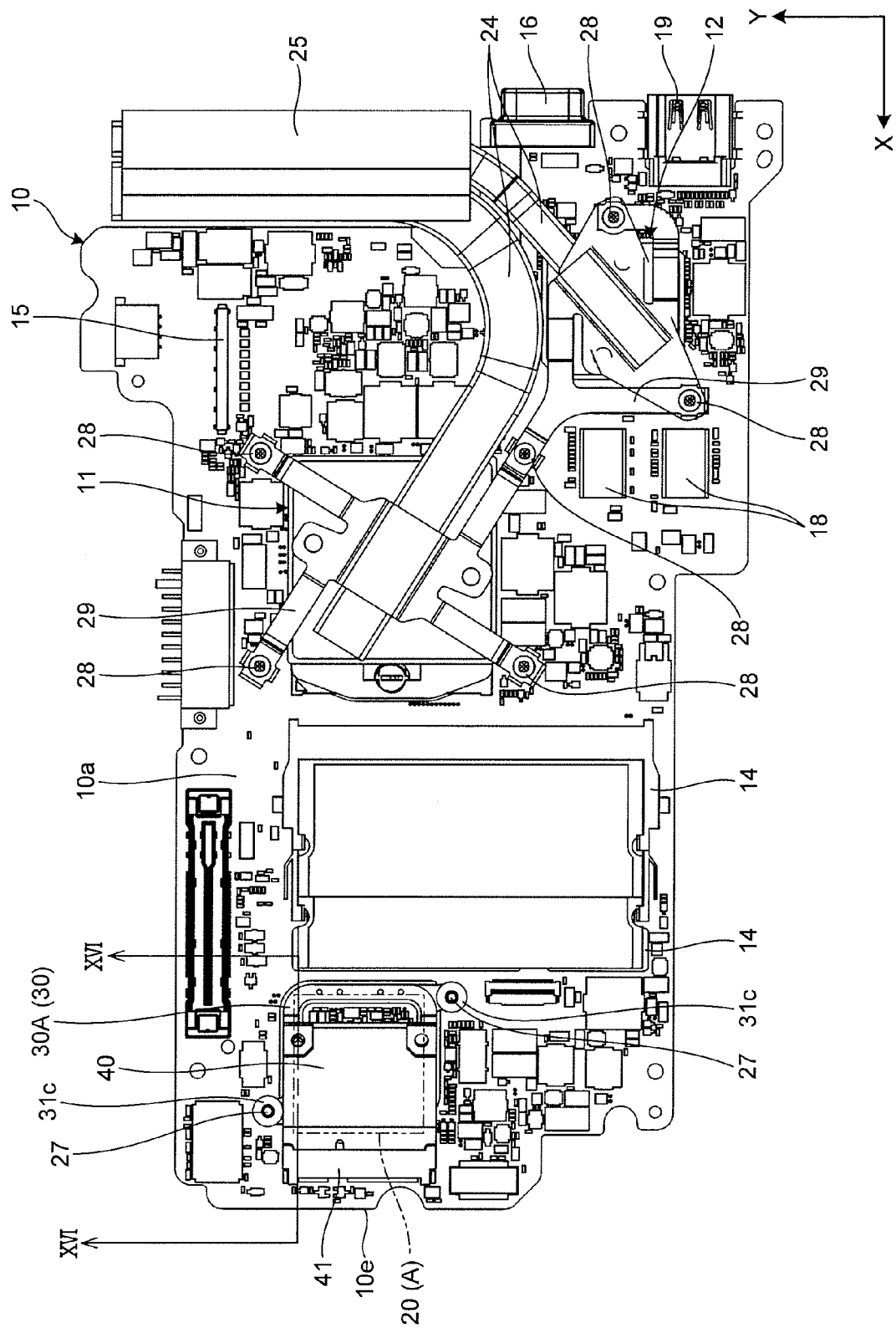
FIG. 9 is an exemplary plan view illustrating one surface side of a circuit board of the electronic apparatus in the second embodiment.

FIG. 9 is a plan view of the circuit board 10 viewed from a surface 10a. A central processing unit (CPU) 11, a graphic controller 12, a power circuit component 13, a memory slot connector 14, a LCD connector 15, an input/output (I/O) connector 16, a power coil, devices 18, connectors 19, and the like are mounted on the surface 10a of the circuit board 10.

Figure 10:
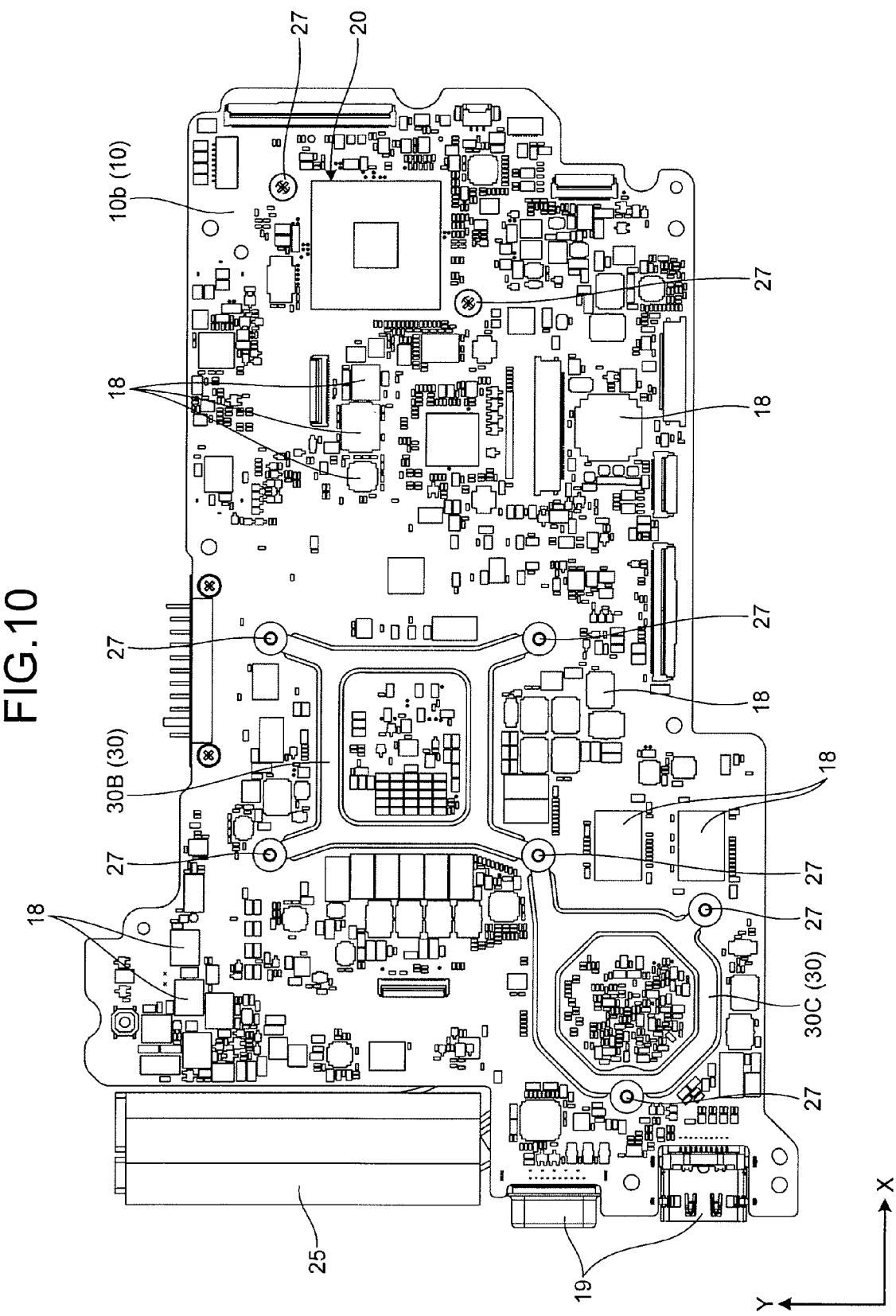
FIG. 10 is an exemplary plan view illustrating the other surface side of the circuit board of the electronic apparatus in the second embodiment.

FIG. 10 is a plan view of the circuit board 10 viewed from the surface 10b. A platform controller hub (PCH) 20, devices 18, connectors 19, and the like are mounted on the surface 10b of the circuit board 10. The PCH 20 is also an example of a heating element. It should be noted that the heating element mounted on the circuit board 10 is not limited to the above.

In this embodiment, each of the CPU 11, the graphic controller 12, the PCH 20, and the like is an example of an integrated circuit (IC) mounted on the circuit board 10, an example of the heating element, and an example of a relatively large-sized component (a module, a device, an electronic component, or a mounted component). It should be noted that the CPU 11 is the component having the largest amount of heat generation. The circuit board 10 having those components mounted thereon is positioned between the upper wall 2c and the lower wall 2d of the housing 2a. It should be noted that the power circuit component 13 is also an example of a component (a heating element, a module, or a device) having a relatively large amount of heat generation.

In this embodiment, reinforcing plates (reinforcing members, members, plates) 30 are provided for relatively large-sized components mounted on the circuit board 10, such as the CPU 11, the graphic controller 12, and the PCH 20. The reinforcing plates 30 can reinforce the circuit board 10, and increase the rigidity. Accordingly, the reinforcing plates 30 can prevent the load of an external force from acting on components or the like, and can prevent the stress on the components from increasing, for example.

The reinforcing plate 30A illustrated in FIG. 9 is provided for the PCH 20, and is positioned at a location corresponding to the back side of the PCH 20 on the surface 10a of the circuit board 10. A reinforcing plate 30B illustrated in FIG. 10 is provided for the CPU 11, and is positioned at a location corresponding to the back side of the CPU 11 on the surface 10b of the circuit board 10. A reinforcing plate 30C illustrated in FIG. 10 is provided for the graphic controller 12, and is positioned at a location corresponding to the back side of the graphic controller 12 on the surface 10b of the circuit board 10. The reinforcing plates 30 are fixed to the circuit board 10 with fixtures (fixing members) 27 such as screws or studs with screws. The male screw portions (not illustrated) of the fixtures 27 penetrate through holes 10c (see FIG. 13) formed on the circuit board 10 from the opposite side of the circuit board 10 with respect to the reinforcing plates 30, and are screwed into female screw holes 30a (see FIG. 12) formed at the reinforcing plates 30. Where the fixtures 27 are studs with screws, female screw holes (not illustrated) are formed in protruding portions (not illustrated) on the opposite side of the male screw portions. A pressing member 29 is fixed to the top ends of the protruding portions by screws 28 screwed into the female screw holes. The pressing member (a pressing member, a fixing member, a member) 29 presses the heat sink 23, the heat pipes 24, and the like against components such as the CPU 11 and the graphic controller 12.

Figure 11:
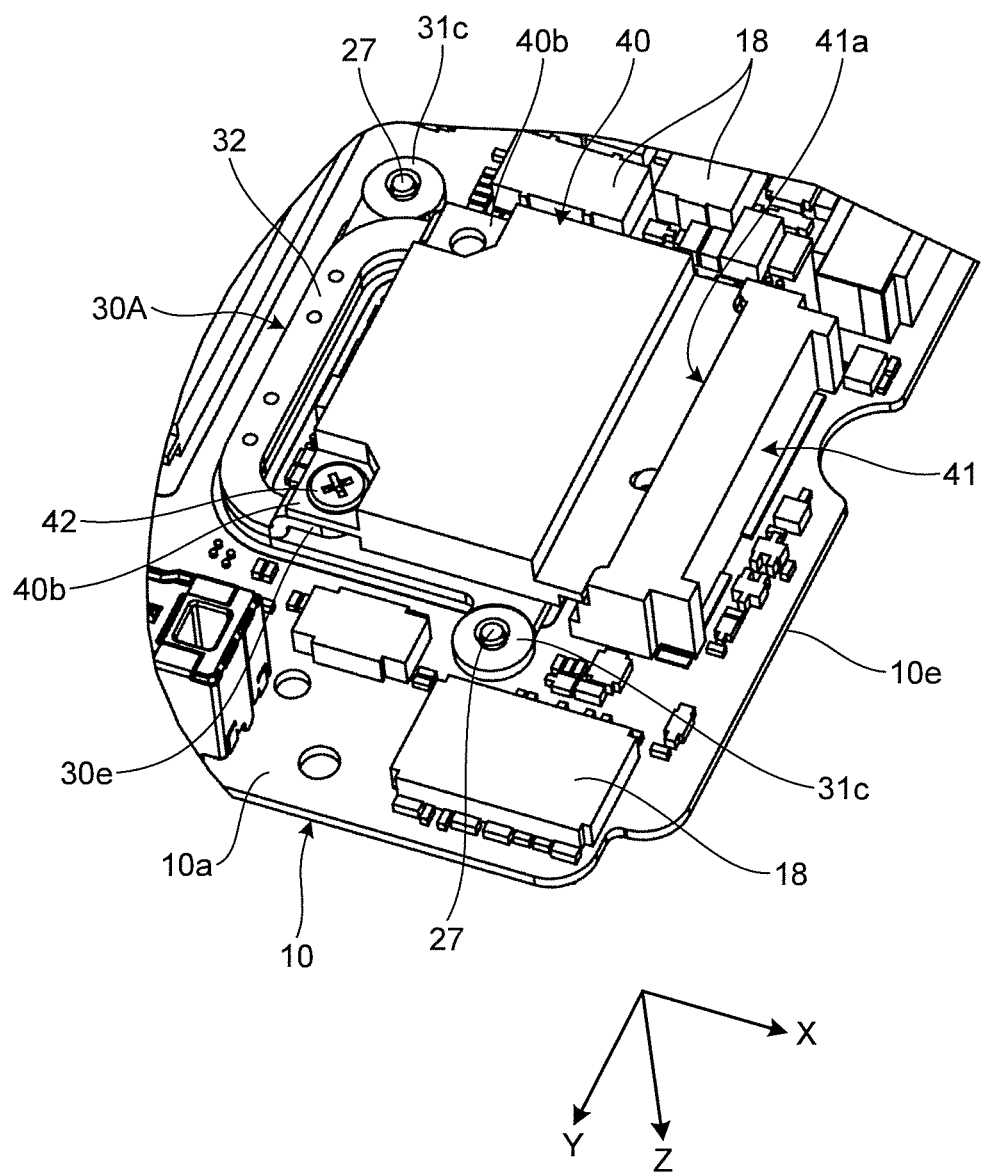
FIG. 11 is an exemplary perspective view illustrating the portion in which a reinforcing plate for a module of the circuit board is provided in the electronic apparatus in the second embodiment.

FIG. 11 is a perspective view of the portion of the circuit board 10 on which the reinforcing plate 30A is provided for the PCH 20. As illustrated in FIG. 11, the reinforcing plate 30A is covered with a wireless LAN module 40. The wireless LAN module 40 is connected to a connector 41. The wireless LAN module 40 is an example of a contained component (a module or component).

Figure 12:
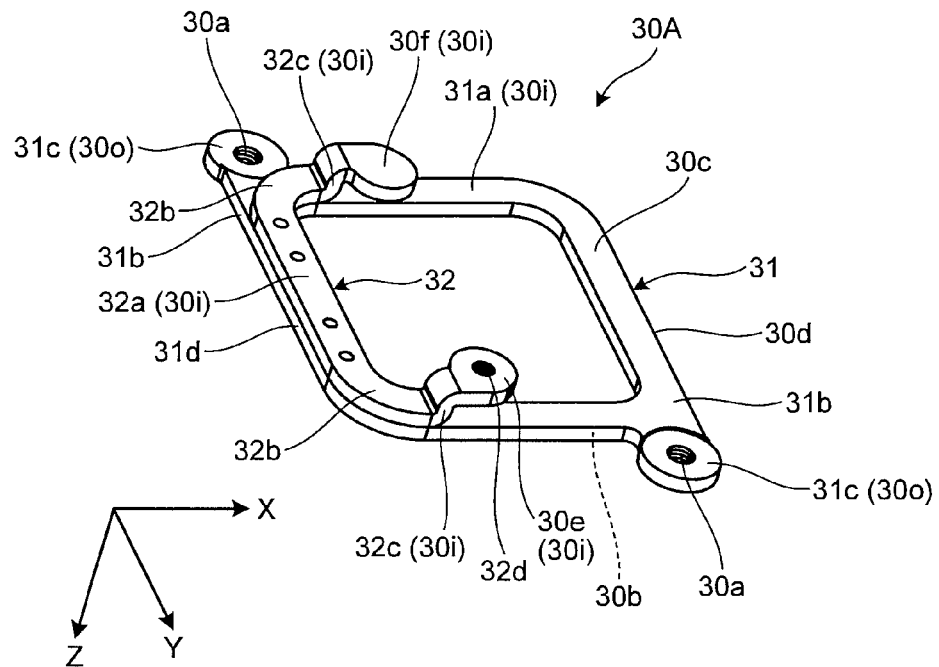
FIG. 12 is an exemplary perspective view illustrating the reinforcing member included in the electronic apparatus in the second embodiment.

FIG. 12 is a perspective view of the reinforcing plate 30A. The reinforcing plate 30A is formed by integrating a first member 31 and a second member 32. The first member 31 comprises a ring-like portion 31a, corner portions 31b, the protrusions 31c, and an end portion 31d. The ring-like portion 31a is designed to have a rectangular ring-like shape. The corner portions 31b are positioned at diagonal corners of the ring-like portion 31a. The protrusions 31c protrude from the corner portions 31b outwardly with respect to the ring-like portion 31a, and each of the protrusions 31c is designed to have a disk-like shape. Female screw holes (fixing portions, screw portions) 30a are formed in the protrusions 31c. The end portion 31d is an example of a side portion of the ring-like portion 31a having the rectangular ring-like shape.

The second member 32 comprises a base 32a, end portions 32b, protrusions 32c, and receiving portions 30e and 30f. The base 32a is placed on the end portion 31d serving as the side portion of the ring-like portion 31a, and extends along the end portion 31d. The base 32a is bent at both end portions 32b to be formed into a U-shape. The protrusions 32c protrude (stand) at both end portions 32b and extend in such a direction as to move gradually away from the first member 31. The receiving portions 30e and 30f are located at the top ends of the protrusions 32c, and are designed to have disk-like shapes that extend along (parallel to) the first member 31. The receiving portion 30e has a female screw hole 32d formed therein. In this embodiment, the second member 32 is an example of a support member, and the base 32a is an example of a second end portion.

The first member 31 and the second member 32 are integrated (joined) by welding (or spot welding or the like), for example. In this embodiment, the end portion 31d of the first member 31 and the base 32a are spot-welded at several points (four points, for example).

The reinforcing plate 30A is arranged along the surface 10a or a surface 10b of the circuit board 10, or preferably, is located in contact with the surface 10a or the surface 10b. In this embodiment, the reinforcing plate 30A is located at the side of the surface 10a of the circuit board 10 and has a first surface 30b (see FIG. 16) that is located in contact with the surface 10a, and a second surface 30c that is located on the opposite side of the first surface 30b and is exposed to the inside of the housing 2a. In a case where the reinforcing plate 30A is located on the side of the surface 10b of the circuit board 10, the first surface 30b is located in contact with the surface 10b of the circuit board 10, and the second surface 30c is exposed to the inside of the housing 2a.

Figure 13:
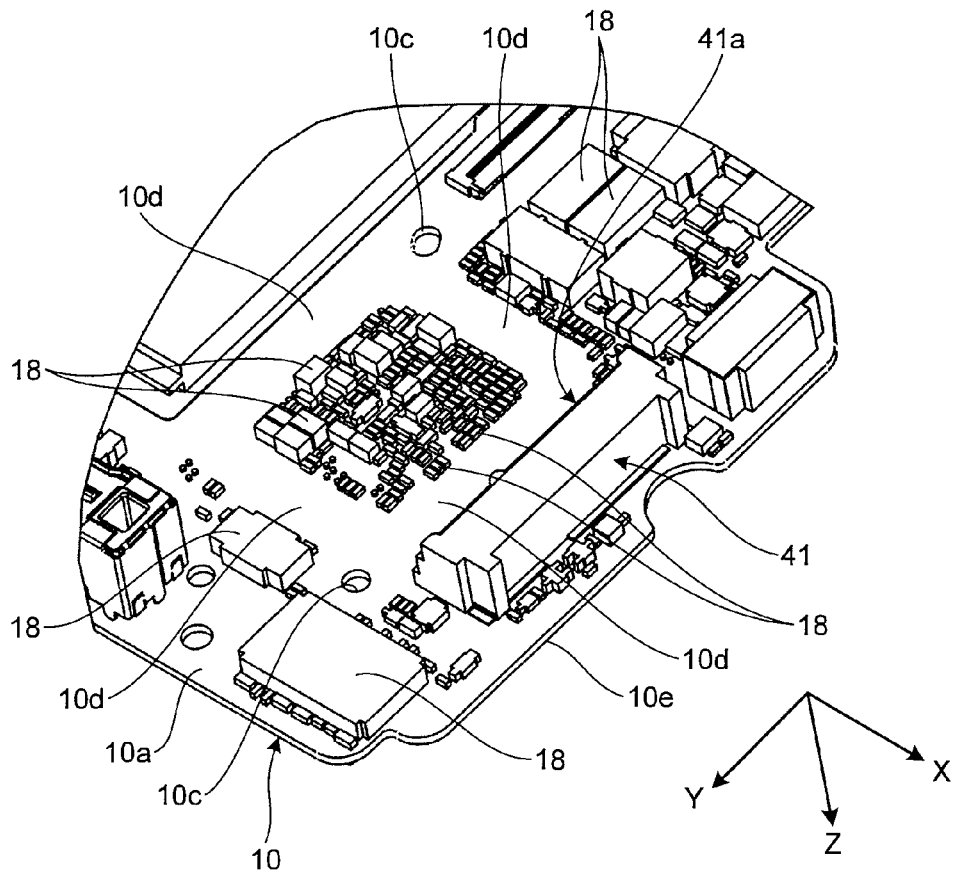
FIG. 13 is an exemplary perspective view illustrating the area in which the reinforcing plate for the circuit board is provided in the electronic apparatus in the second embodiment.
Figure 14:
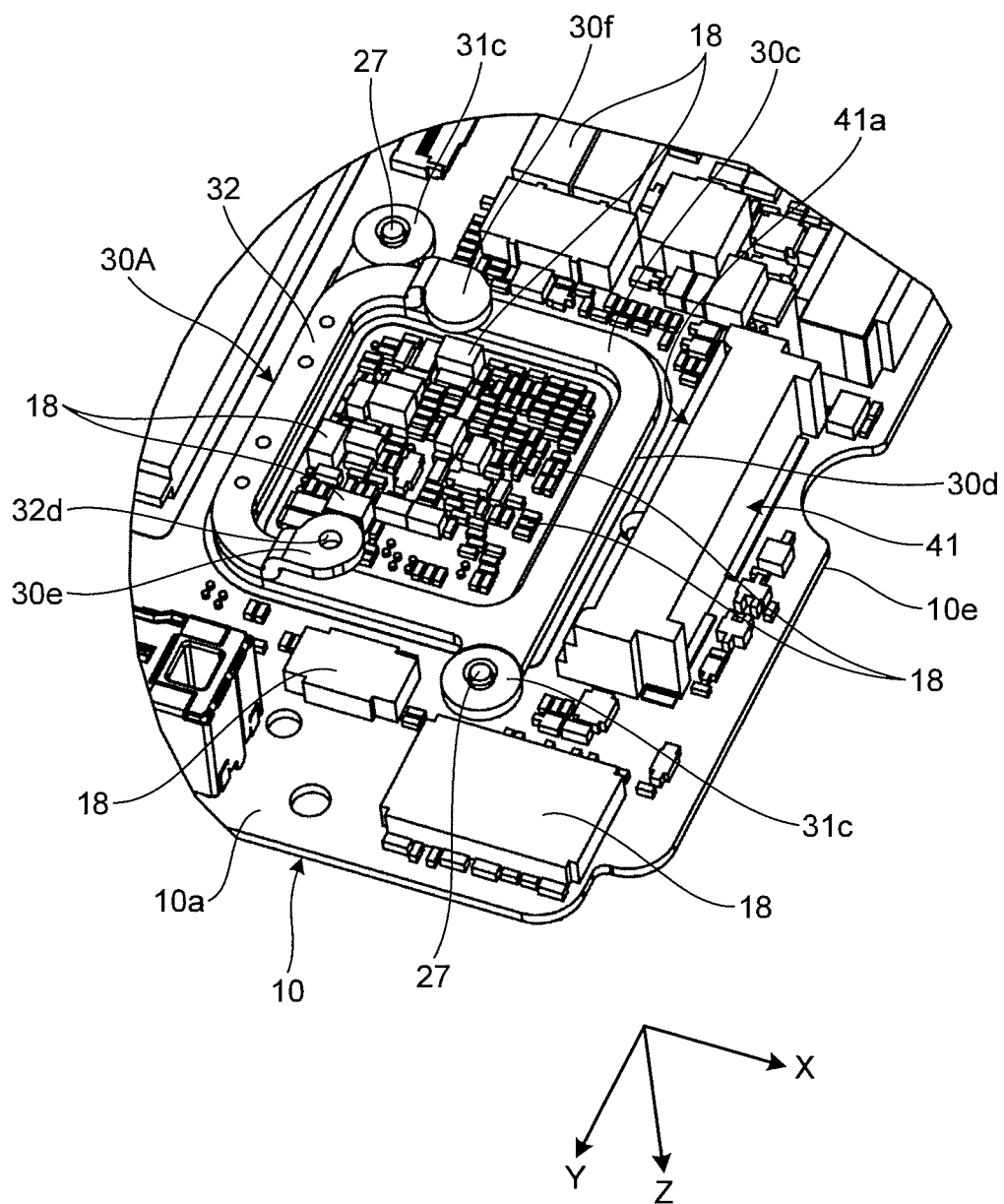
FIG. 14 is an exemplary perspective view illustrating a situation where a wireless LAN module is removed from the structure illustrated in FIG. 11 in the second embodiment.

FIG. 13 is a perspective view of an area (a non-mounting area 10d) of the circuit board 10 to which the reinforcing plate 30A is to be attached, or a diagram illustrating a situation where the wireless LAN module 40 and the reinforcing plate 30A are removed from the structure illustrated in FIG. 11. FIG. 14 is a perspective view illustrating a situation where the wireless LAN module 40 is detached from the structure illustrated in FIG. 11, or a situation seen before the wireless LAN module 40 is attached to the structure. As illustrated in FIG. 13, the through holes 10c through which the fixtures 27 penetrate are formed on the circuit board 10. The component non-mounting area 10d that has the same rectangular ring-like shape as the reinforcing plate 30A is formed on the surface 10a of the circuit board 10. Relatively small devices (components or modules) 18 (with small heights) are mounted at locations inside the non-mounting area 10d on the surface 10a of the circuit board 10. As illustrated in FIG. 14, the reinforcing plate 30A is placed (positioned) on the non-mounting area 10d, and the fixtures 27 are screwed to the protrusions 31c, so that the reinforcing plate 30A is secured to the circuit board 10. The devices 18 provided in the non-mounting area 10d are an example of a third module.

Figure 15:
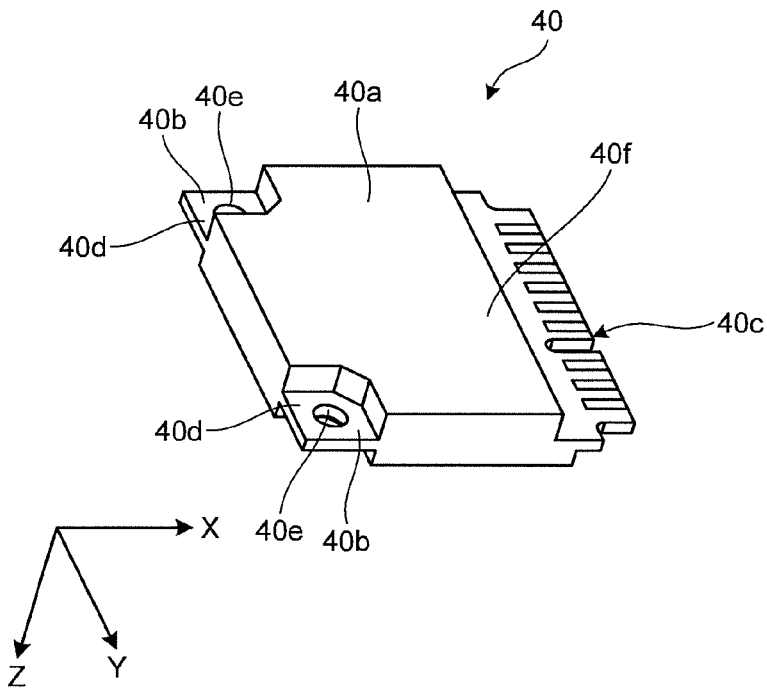
FIG. 15 is an exemplary perspective view illustrating the wireless LAN module included in the electronic apparatus in the second embodiment.

FIG. 15 is a perspective view of the wireless LAN module 40. The wireless LAN module 40 externally appears to have a rectangular shape (or a square shape) when viewed from the thickness direction, as also illustrated in FIG. 8 and others. The wireless LAN module 40 comprises a body 40a, flanges 40b, and connector portions 40c. The body 40a is designed to have a flat parallelepiped shape. The flanges 40b are formed as rectangular, relatively thin plate-like portions at two corner portions 40d serving as the two end portions of a side of the rectangle. Through holes 40e are formed at the respective flanges 40b. The connector portions 40c protrude outwardly from an end portion (a side portion) 40f located on the opposite side of the two corner portions 40d, and have substantially the same widths along the end portion 40f.

As illustrated in FIGS. 11 and 14 and others, the connector 41 is designed to have a thin, long rectangular shape. The connector 41 is arranged along an end portion 10e of the circuit board 10, and is located between the end portion 10e and an end portion 30d of the reinforcing plate 30A. The end portion 10e of the circuit board 10, the connector 41, and the end portion 30d of the reinforcing plate 30A are provided along (parallel to) one another. The connector 41 is fixed onto the surface 10a by soldering, for example.

Figure 16:
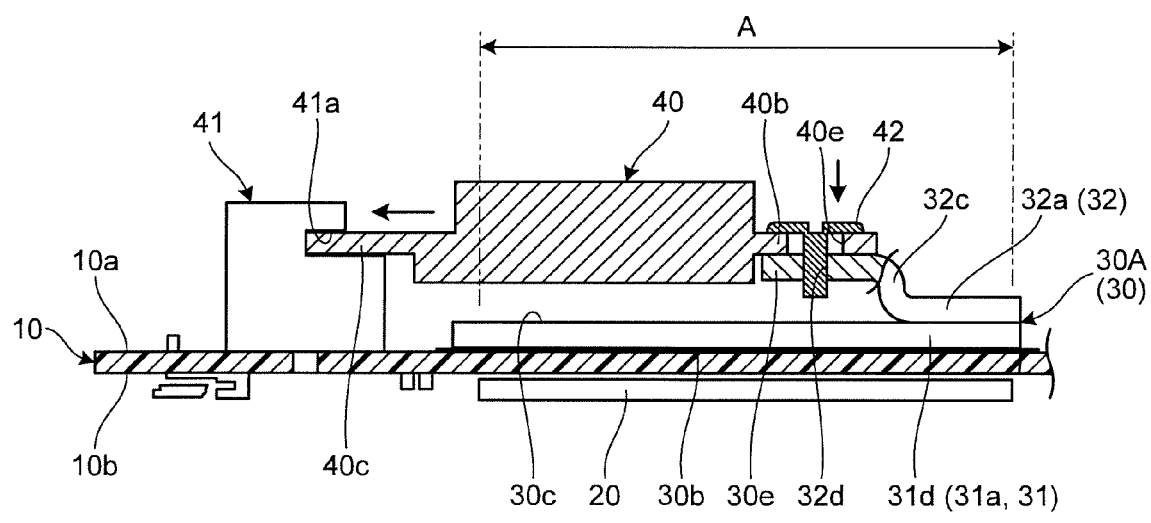
FIG. 16 is an exemplary cross-sectional view of the structure illustrated in FIG. 9, taken along the line XVI-XVI.

FIG. 16 is a cross-sectional view of the structure illustrated in FIG. 9, taken along the line XVI-XVI. A connection portion 41a is formed at the connector 41. The connection portion 41a is located at a distance from the surface 10a of the circuit board 10, and is open to a side of the reinforcing plate 30A. The connection portion 41a is connected to the connector portions 40c of the wireless LAN module 40. After inserting the connector portions 40c of the wireless LAN module 40 into the connection portion 41a of the connector 41, a worker places the flanges 40b of the wireless LAN module 40 onto the receiving portions 30e and 30f of the reinforcing plate 30A. The worker then screws a fixture 42 such as a screw penetrating through the through hole 40e of one of the flanges 40b into the female screw hole 32d of the receiving portion 30e of the reinforcing plate 30A. The connection portion 41a allows the connector portions 40c to move in such a direction (toward the right in FIG. 16) as to open the connection portion 41a, and to rotate in such a direction (upward in FIG. 16) that the flanges 40b pop up. The connection portion 41a prohibits the connector portions 40c from moving and rotating in any other directions. Accordingly, by securing one of the flanges 40b to the receiving portion 30e with the fixture 42, the wireless LAN module 40 can be secured in the situation illustrated in FIGS. 11 and 16. In view of this, the receiving portion 30e is an example of a securing portion (a fixing portion). Meanwhile, the other one of the flanges 40b is placed on the receiving portion 30f, but is not fixed thereto. In view of this, the receiving portion 30f is an example of a placement portion (a support member) supporting the other one of the flanges 40b. The receiving portion 30e is an example of a first end portion, and the receiving portion 30f is an example of a third end portion.

As is apparent from FIG. 16, the wireless LAN module 40 is positioned at a distance from the surface 10a of the circuit board 10 and is located above the surface 10a. Also, the wireless LAN module 40 is arranged along (parallel to) the surface 10a. Further, the wireless LAN module 40 is supported by the reinforcing plate 30A and the connector 41 at both ends.

Also, as is apparent from FIG. 16, the wireless LAN module 40 is positioned in an area corresponding to the back side of the PCH 20. In an area (an area on the surface 10b) corresponding to the back side of the area in which a relatively large component (the module or the first module) such as the CPU 11, the graphic controller 12, or the PCH 20 is mounted on the circuit board 10, interconnects (not illustrated) are arranged on the circuit board 10. Therefore, in such an area, it is difficult to set a support component (such as a support member, a fixing member, a fixing component, a connector, or a stud, particularly a component having a portion to be inserted into the circuit board 10) for supporting or securing another component (the module or the second module). Therefore, in conventional cases, the component (the module or the second module) that requires installment of the above support component on the circuit board 10 is not provided in the area corresponding to the back side of such a component.

With attention being paid to the fact that the reinforcing plate 30A (30) is provided in the area corresponding to the back side of such a component (the module or the first module) in some cases, the reinforcing plate 30A is used to support or secure another component (the module or the second module) in this embodiment. According to this embodiment, another component (the module or the second module) can be easily set in the area corresponding to the back sides of the component (the module or the first module). Accordingly, the component (the module) can be more efficiently arranged on the circuit board 10, for example. Also, the circuit board 10 or the housing 2a (the first unit 2) or the electronic apparatus 1 can be made smaller, for example. In this embodiment, the surface 10b of the circuit board 10 is an example of a first surface. The PCH 20 is an example of the first module. The surface 10a of the circuit board 10 is an example of a second surface. The wireless LAN module 40 is an example of the second module. The reinforcing plate 30A is an example of the reinforcing member or the member.

As illustrated in FIG. 12, the reinforcing plate 30A comprises an inner portion 30i that is located inside of the peripheral portion of an area A (see FIGS. 9 and 16) corresponding to the opposite side (the back side) of the PCH 20 at the side of the surface 10a. The inner portion 30i comprises the ring-like portion 31a of the first member 31, and the base 32a, the protrusions 32c, and the receiving portions 30e and 30f of the second member 32. The reinforcing plate 30A also comprises an outer portion 30o located outside of the peripheral portion of the area A at the side of the surface 10a. The outer portion 30o comprises the protrusions 31c of the first member 31. As described above, in this embodiment, the reinforcing plate 30A comprises the outer portion 30o that is located outside of the peripheral portion of the area A and is secured to the circuit board 10, and the inner portion 30i that is connected to the outer portion 30o and is located inside of the peripheral portion of the area A. The reinforcing plate 30A supports or secures the wireless LAN module 40 at the inner portion 30i. Accordingly, the wireless LAN module 40 can be at a distance from the surface 10a and at a position corresponding to the back side of the PCH 20 and be located at a position overlapping with the PCH 20, as illustrated in FIG. 16. Thus, the component mounting efficiency in the circuit board 10 can be more easily made higher.

As illustrated in FIG. 9, the connector 41 serving as one of the support points for the wireless LAN module 40 is located outside the area A, or outside the periphery of the reinforcing plate 30A. Accordingly, the connector 41 can be more easily formed on the circuit board 10. The connector portions 40c formed at one end are supported by (and are electrically connected to) the connector 41 outside the periphery of the reinforcing plate 30A, and the flanges 40b formed at the other end are supported by (or are fixed to) the reinforcing plate 30A at locations inside the periphery of the reinforcing plate 30A. Accordingly, the wireless LAN module 40 can be more easily provided, without being electrically connected to the circuit board 10 at a location inside the peripheral portion of the reinforcing plate 30A. In this embodiment, the flanges 40b are an example of a first supported area, and the connector portions 40c are an example of a second supported area.

As illustrated in FIG. 9, the connector 41 is also provided at the opposite side of the reinforcing plate 30A (or the PCH 20) from other components (a module or a fourth module) such as the memory slot connector 14 and the CPU 11 on the circuit board 10. Since a relatively large number of interconnects are arranged between the PCH 20 and the memory slot connector 14 or the CPU 11 or the like in the circuit board 10, or inside the circuit board 10 with respect to the PCH 20, it might be difficult to form the connector 41 in some cases. In this embodiment, on the other hand, the connector 41 is provided at the opposite side of the reinforcing plate 30A (or the PCH 20) from the other components (a module or a fourth module) such as the memory slot connector 14 and the CPU 11 on the circuit board 10, or is provided at a peripheral side of the circuit board 10. Accordingly, interferences among the interconnects can be easily restrained, and the connector 41 is more easily provided. Also, in this embodiment, the connector 41 is provided at the end portion 10e of the circuit board 10 (or near the end portion 10e or on the periphery of the circuit board 10). Accordingly, interferences among the interconnects can be easily restrained, and the connector 41 can be easily provided.

Figure 17:
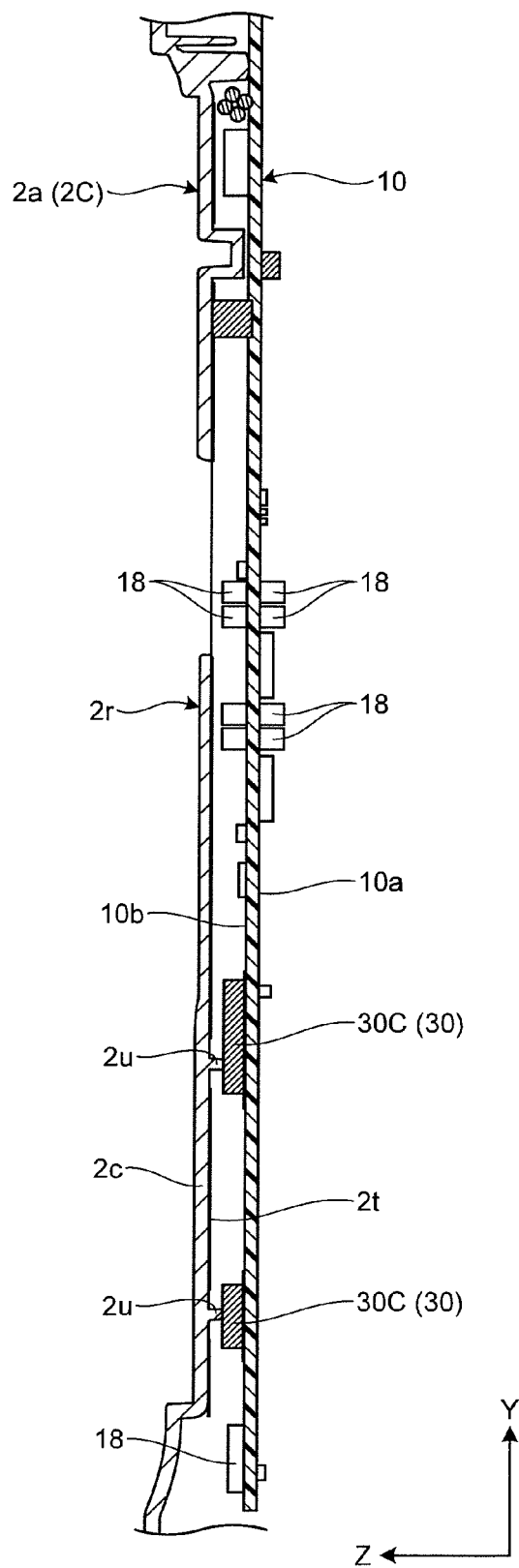
FIG. 17 is an exemplary cross-sectional view of the structure illustrated in FIG. 8, taken along the line XVII-XVII.

FIG. 17 is a cross-sectional view of the structure illustrated in FIG. 8, taken along the line XVII-XVII. As illustrated in FIG. 17, in this embodiment, the protrusions 2u (see FIG. 7) formed on the back surface 2t of the upper wall 2c of the housing 2a are in contact with the second surface 30c of the reinforcing plate 30C provided on the surface 10b of the circuit board 10. That is, the reinforcing plate 30C functions as the support member (the contact portion) for the protrusions 2u (or the upper wall 2c). Accordingly, the reinforcing plate 30C can prevent the upper wall 2c from denting or bending inwardly with respect to the housing, for example. The area of the upper wall 2c in which the protrusions 2u are formed corresponds to the bottom wall of the concavity 2r in which the keyboard 5 is housed (placed). Accordingly, in this embodiment, the keyboard 5 as a component (a module) provided at (or supported by) the upper wall 2c can be prevented from sinking, floating, sagging, popping up, moving up and down, vibrating, or the like, for example. In FIG. 17, only the reinforcing plate 30C is illustrated. However, the corresponding protrusions 2u (see FIG. 7) are also in contact with the reinforcing plate 30B.

In this embodiment having the above described structure, the reinforcing plate 30A is used for supporting or securing the wireless LAN module 40 serving as an example of the contained component (the module or component). Therefore, the number of components can be made smaller than that in a case where components for supporting or securing the wireless LAN module 40 are separately provided on the circuit board 10, for example. Also, since the number of components provided on the circuit board 10 is reduced, interconnects can be more easily arranged on the circuit board 10, for example.

In this embodiment, the reinforcing plate 30A comprises the second member 32 for the support member. Accordingly, the reinforcing plate 30A can be formed as a component with a higher rigidity. Also, the reinforcing plate 30A can be more easily manufactured. Also, by taking advantage of a conventional reinforcing plate not having a support member, the reinforcing plate 30A having the function to support or secure the contained component can be more efficiently manufactured. Further, by varying the specific properties (such as the material and the bending rigidity) between the first member 31 and the second member 32, the reinforcing plate 30A can more easily realize the two functions (the functions to reinforce the circuit board 10 and to support or secure the contained component). It should be noted that the first member 31 and the second member 32 can be joined by a technique other than welding, (such as screwing, adhesion, bonding, or engaging). The first member 31 or the second member 32 may be made of a material such as a synthetic resin material, instead of a metal material.

Also, in this embodiment, the wireless LAN module 40 as an example of the contained component is supported by the connector 41 as an example of a support component in an area outside the ring-like portion 31a as an example of the periphery of the reinforcing plate 30A. Accordingly, a contained component of a larger size can be more easily provided, for example. Also, the contained component and the circuit board 10 can be electrically connected with ease, for example.

In this embodiment, the flanges 40b as the first supported area of the wireless LAN module 40 are placed on the reinforcing plate 30A from the opposite side of a side where the circuit board 10 is arranged. Accordingly, the wireless LAN module 40 as an example of the contained component can be more easily supported or secured by the reinforcing plate 30, for example.

Also, in this embodiment, the wireless LAN module 40 as an example of the contained component is supported or secured by the connector 41 as an example of a support component. Therefore, the number of components can be made smaller than that in a case where components for supporting or securing the wireless LAN module 40 are separately provided on the circuit board 10, for example.

Also, in this embodiment, the wireless LAN module 40 as an example of the contained component is supported or secured by the two receiving portions 30e and 30f serving as the first end portion and the third end portion of the reinforcing plate 30A, for example. Accordingly, the wireless LAN module 40 can be more stably supported, for example. Also, the wireless LAN module 40 as an example of the contained component is secured by the receiving portion 30e, and is supported by the receiving portion 30f. Accordingly, the effort required to attach the wireless LAN module 40 can be made smaller than that in a case where the wireless LAN module 40 is secured to the reinforcing plate 30 at several points, for example.

In this embodiment, the electronic apparatus 1 comprises the PCH 20, the wireless LAN module 40, and the reinforcing plate 30A. The PCH 20 is an example of a module provided at the side of the surface 10b as the first surface of the circuit board 10. The wireless LAN module 40 is an example of a module provided at the side of the surface 10a as the second surface. The reinforcing plate 30A is an example of the reinforcing member that is located at a position corresponding to the opposite side of the PCH 20 at the side of the surface 10a, reinforces the circuit board 10, and supports the wireless LAN module 40. That is, the wireless LAN module 40 is located in the area corresponding to the back side of the area in which the PCH 20 is mounted. Accordingly, in this embodiment, the component mounting efficiency in the circuit board 10 can be made higher, for example. Also, the degree of flexibility in the layout of the components in the circuit board 10 can be made higher, for example.

In this embodiment, the electronic apparatus 1 comprises the PCH 20, the wireless LAN module 40, and the reinforcing plate 30A. The PCH 20 is an example of a module provided at the side of the surface 10b as the first surface of the circuit board 10. The wireless LAN module 40 is an example of a module provided at the side of the surface 10a as the second surface. The reinforcing plate 30A comprises the inner portion 30i that is located at the side of the surface 10a and is located on or inside the periphery of the area corresponding to the opposite side of the PCH 20, and the outer portion 30o located outside the area A. The reinforcing plate 30A is an example of the member that supports or secures the wireless LAN module 40 at the inner portion 30i. That is, according to this embodiment, the reinforcing plate 30A as the above described component can be used to support or secure the wireless LAN module 40. Therefore, the number of components can be made smaller than that in a case where components for supporting or securing the wireless LAN module 40 are separately provided on the circuit board 10, for example. Also, the wireless LAN module 40 can be located in the area corresponding to the back side of the area in which the PCH 20 is mounted. Accordingly, the component mounting efficiency in the circuit board 10 can be made higher, for example. Also, the degree of flexibility in the layout of the components in the circuit board 10 can be made higher, for example.

In the following, modifications are described. In each of the following modifications, one or more of the components of the above described first or second embodiment are replaced with one or more components. In the following, the replaced portions are mainly described. The structures of the portions that are not described below or are not illustrated in the drawings are basically the same as those of the above described first or second embodiment, and therefore, the same functions and effects based on those like structures can be achieved by the following modifications.

First Modification

Figure 18:
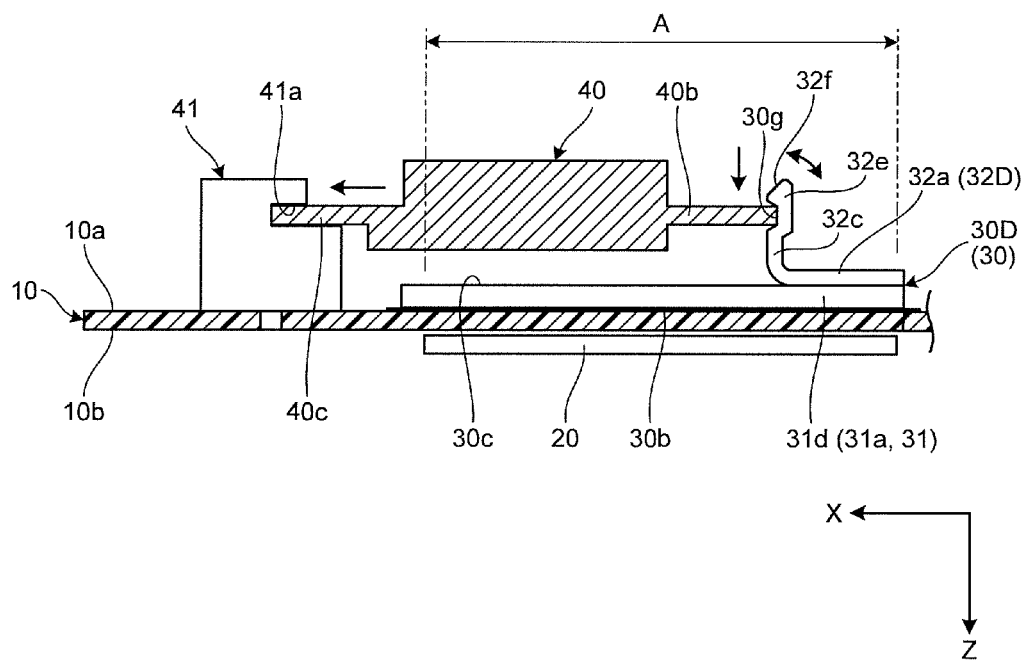
FIG. 18 is an exemplary cross-sectional view illustrating part of a circuit board comprising a reinforcing plate for an electronic apparatus according to a first modification.

FIG. 18 is a cross-sectional view illustrating an example of a circuit board 10 comprising a reinforcing plate 30D according to a first modification. In this modification, the reinforcing plate 30D that can replace the reinforcing plate 30A comprises a second member 32D, instead of the second member 32. Protrusions 32c of the second member 32D are designed to be elastically deformable, and are elastically deformed when the wireless LAN module 40 is mounted. Specifically, after the connector portions 40c of the wireless LAN module 40 are inserted, with a finger or the like of a worker, into the connection portion 41a of the connector 41 illustrated on the left side in FIG. 18, the flanges 40b of the wireless LAN module 40 are brought close to top ends 32e of the second member 32D from the upper side in FIG. 18. Sloping surfaces 32f are formed at the top ends 32e. Accordingly, the flanges 40b that are pushed from the upper side in FIG. 18 and are brought into contact with the sloping surfaces 32f cause the second member 32D to elastically deform in such a direction that the top ends 32e move further away from the connector 41. As a result, the distance between the connector 41 as a support member and the second member 32D as the other support member becomes longer, and the wireless LAN module 40 can reach the holding position therefor. The flanges 40b then move past the top ends 32e and reach holders 30g formed as concavities in the second member 32D. At this point, the second member 32D moves back in such a direction that the top ends 32e move closer to the connector 41. That is, according to this modification, it is possible to more easily realize a situation where the wireless LAN module 40 as an example of the contained component is supported by the reinforcing plate 30D through a simpler attaching operation (with a fingertip, for example).

Second Modification

Figure 19:
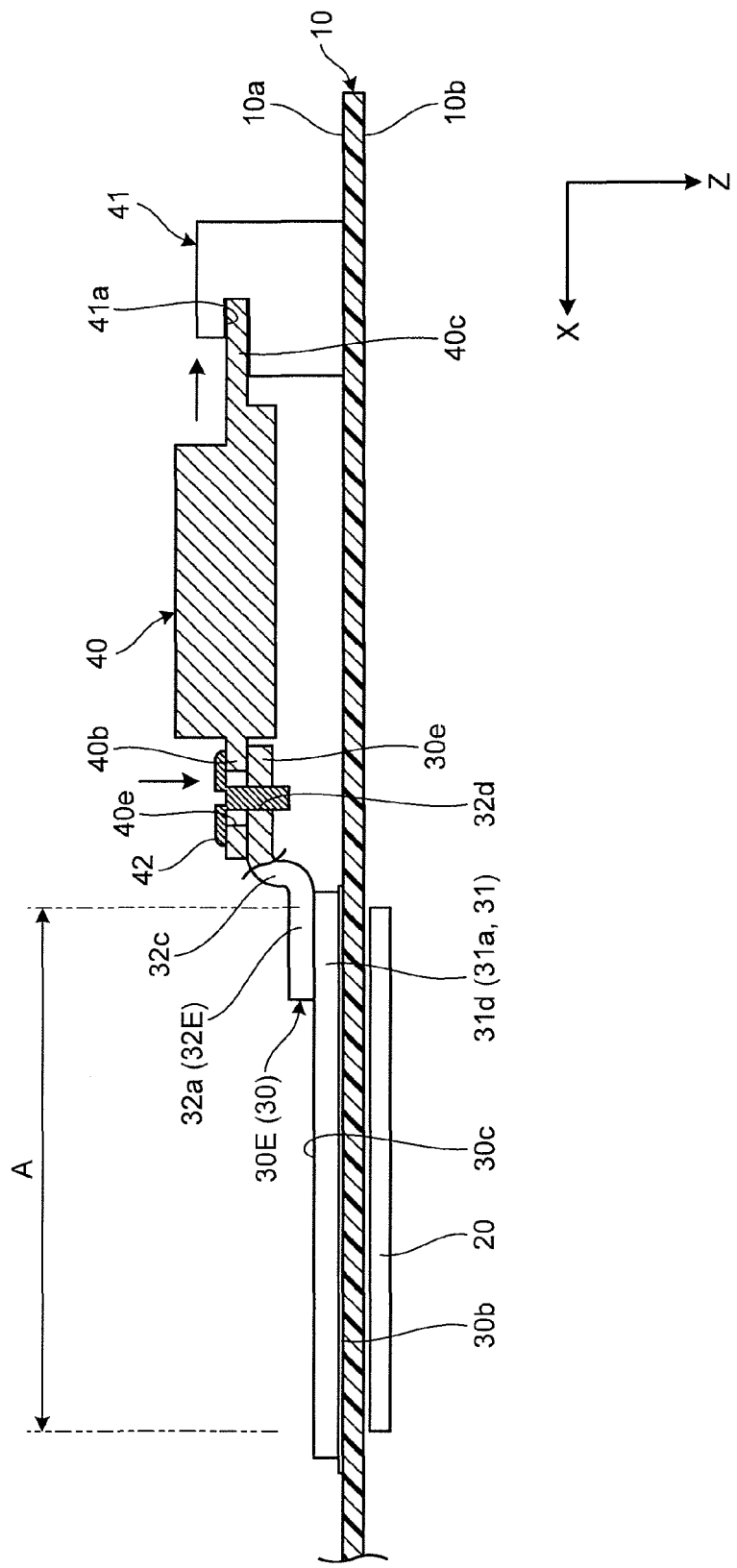
FIG. 19 is an exemplary cross-sectional view illustrating part of a circuit board comprising a reinforcing plate for an electronic apparatus according to a second modification.

FIG. 19 is a cross-sectional view illustrating an example of a circuit board 10 comprising a reinforcing plate 30E according to a second modification. In this modification, the reinforcing plate 30E that can replace the reinforcing plate 30A comprises a second member 32E, instead of the second member 32. The second member 32E protrudes into an area outside the periphery of the area A corresponding to the opposite side of the PCH 20, and the wireless LAN module 40 as an example of the contained component is located in the area outside the periphery of the area A. According to this modification, the reinforcing plate 30E can be used to support or secure the wireless LAN module 40 as an example of the contained component.

Third Modification

Figure 20:
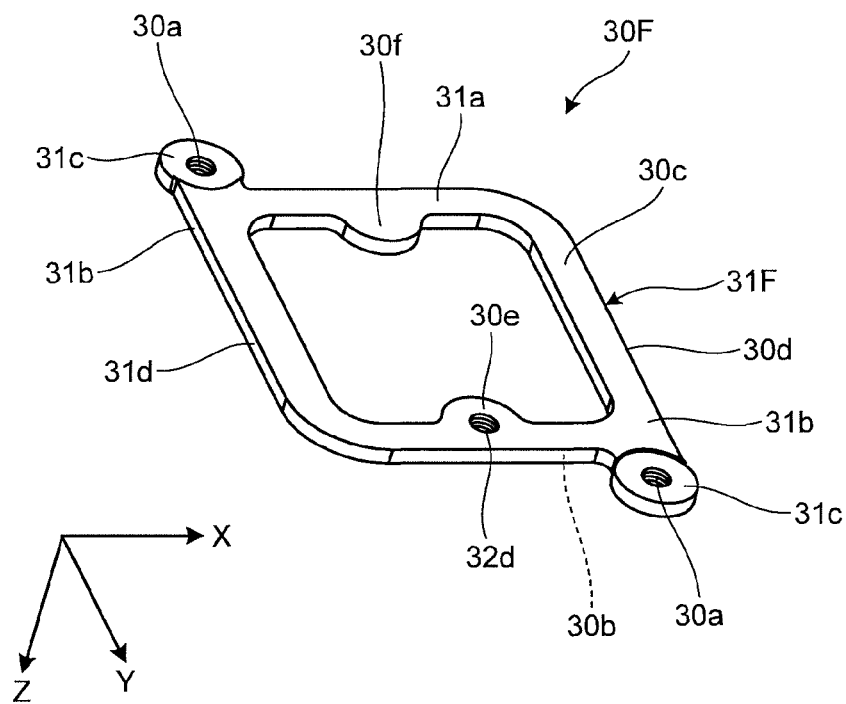
FIG. 20 is an exemplary perspective view illustrating a reinforcing plate for an electronic apparatus according to a third modification.

FIG. 20 is a perspective view illustrating an example of a reinforcing plate 30F according to a third modification. In this modification, the reinforcing plate 30F that can replace the reinforcing plate 30A comprises a first member 31F having receiving portions 30e and 30f. According to this modification, the reinforcing plate 30F can also be used to support or secure the wireless LAN module 40 as an example of the contained component. This modification is more effective in a case where the wireless LAN module 40 can be brought closer to the circuit board 10. Also, the distance from the circuit board 10 can be made longer by making the first member 31F partially or totally thicker. In this modification, the receiving portions 30e and 30f are an example of a contact portion.

Fourth Modification

Figure 21:
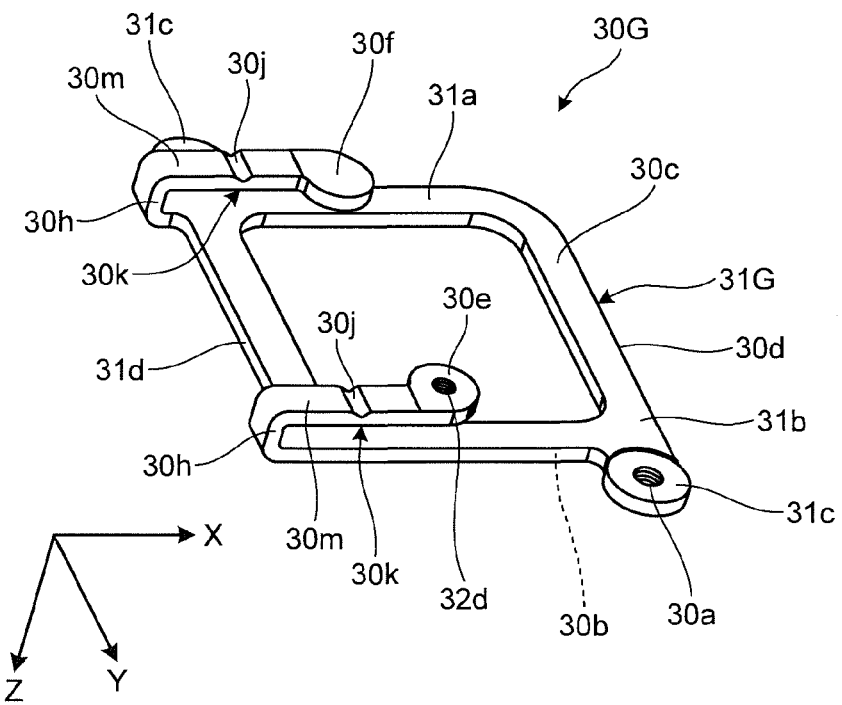
FIG. 21 is an exemplary perspective view illustrating a reinforcing plate for an electronic apparatus according to a fourth modification.

FIG. 21 is a perspective view illustrating an example of a reinforcing plate 30G according to a fourth modification. In this modification, the reinforcing plate 30G that can replace the reinforcing plate 30A comprises a first member 31G that is bent so that receiving portions 30e and 30f are located at a longer distance from the circuit board 10. Specifically, protrusions 30h standing and extending in such a direction as to move away from the circuit board 10 are formed on the peripheral side of a ring-like portion 31a, and arms 30m extending from the top ends of the protrusions 30h toward the inside of the ring-like portion 31a are formed along the surface 10a of the circuit board 10. Receiving portions 30e and 30f are formed at the top ends of arms 30m. The locations of the receiving portions 30e and 30f may be either the same as or different from those in the case of the reinforcing plate 30A. According to this modification, the number of components of the reinforcing plate 30G can be reduced, and the effort required for manufacturing a reinforcing plate can be reduced accordingly. In this modification, the receiving portions 30e and 30f are also an example of the contact portion.

In this modification, concavities 30j are further formed in the arms 30m (or in some portions of protrusions protruding from contacts with the circuit board 10), so as to form narrowed portions 30k. By virtue of the narrowed portions 30k, the elasticity (or the rigidity or flexibility) of the arms 30m can be arbitrarily set, for example. Also, the narrowed portions 30k may serve as easily-breaking portions that are more easily broken than other portions when an external force such as an impact load is applied, for example. In this modification, the receiving portions 30e and 30f are also an example of the contact portion.

Fifth Modification

Figure 22:
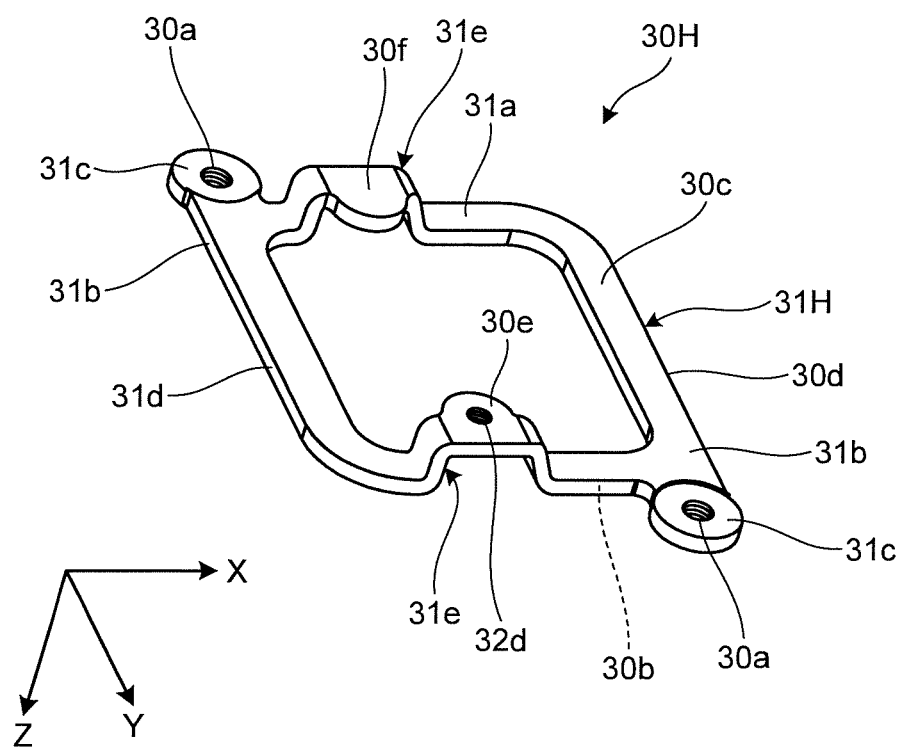
FIG. 22 is an exemplary perspective view illustrating a reinforcing plate for an electronic apparatus according to a fifth modification.

FIG. 22 is a perspective view illustrating an example of a reinforcing plate 30H according to a fifth modification. In this modification, the reinforcing plate 30H that can replace the reinforcing plate 30A comprises a first member 31H that is bent so that receiving portions 30e and 30f are located at a longer distance from the circuit board 10. Specifically, protrusions 31e each protruding in an upside-down U-shape are formed on two sides of a ring-like portion 31a facing each other, and the receiving portions 30e and 30f are formed at the top ends (the protruding ends) of the protrusions 31e. The locations of the receiving portions 30e and 30f may be either the same as or different from those in the case of the reinforcing plate 30A. According to this modification, the number of components constituting the reinforcing plate 30H can be reduced, and the effort required for manufacturing a reinforcing plate can be reduced accordingly, for example.

Sixth Modification

Figure 23:
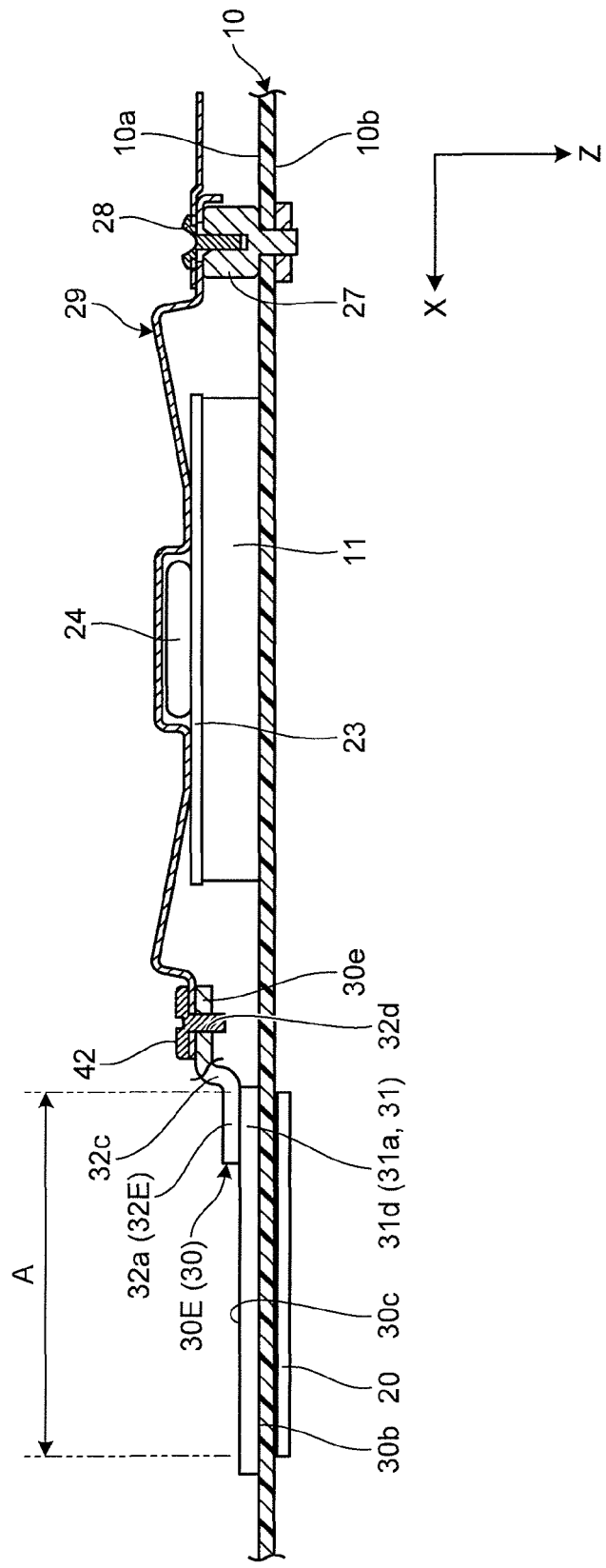
FIG. 23 is an exemplary cross-sectional view illustrating a circuit board comprising a reinforcing plate for an electronic apparatus according to a sixth modification.

FIG. 23 is a cross-sectional view illustrating an example of a circuit board 10 comprising a reinforcing plate 30E according to a sixth modification. In this modification, the reinforcing plate 30E having the same structure as that of the second modification secures or supports a pressing member 29 as an example of the contained component. According to this modification, the number of components supporting or securing the pressing member 29 to the circuit board 10 can be reduced, for example. Therefore, the number of components can be made smaller than that in a case where components for supporting or securing the pressing member 29 are separately provided on the circuit board 10, for example. Also, since the number of components provided on the circuit board 10 is reduced, interconnects can be more easily arranged on the circuit board 10, for example. Also, in this modification, receiving portions 30e and 30f are provided between the PCH 20 and the CPU 11 serving as modules (components). Accordingly, interconnects can be easily formed on the circuit board 10 between those modules, while the pressing member 29 can be easily provided.

Seventh Modification

Figure 24:
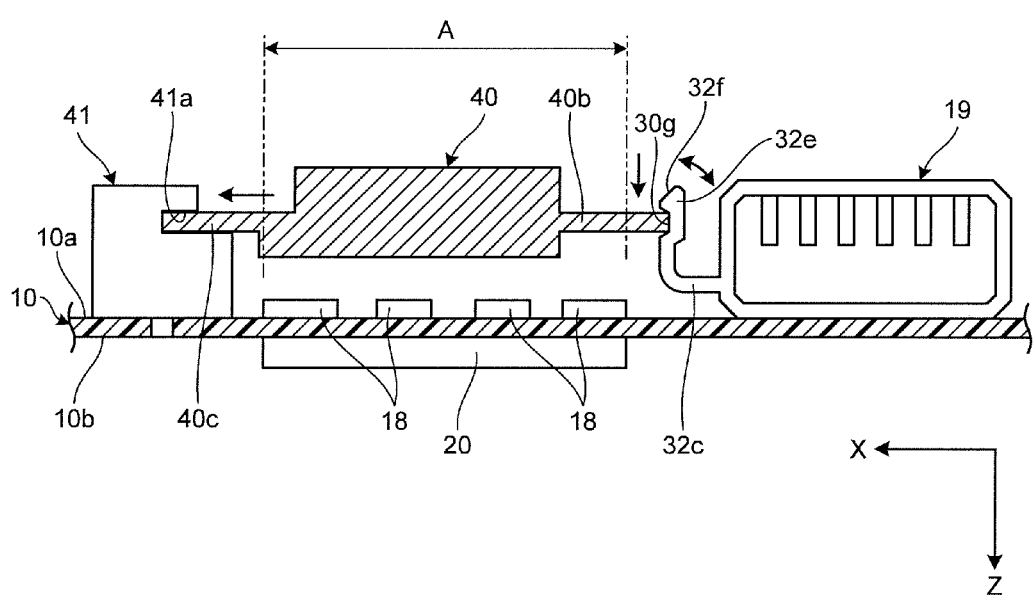
FIG. 24 is an exemplary cross-sectional view illustrating a circuit board comprising a connector as a support member for an electronic apparatus according to a seventh modification.

FIG. 24 is a cross-sectional view illustrating an example of a circuit board 10 comprising a connector 19 as a support member according to a seventh modification. In this modification, the connector 19 as an example of a module (a component or a fifth module) provided on the circuit board 10 is an example of the support member for the wireless LAN module 40 as an example of the contained component. The connector 19 has protrusions 32c that can be elastically deformed like those in the first modification. Accordingly, as in the first modification, it is possible to more easily realize a situation where the wireless LAN module 40 as an example of the contained component is supported by the connector 19 through a simpler attaching operation (with a fingertip, for example). Also, the number of required components can be reduced, for example. Also, since the number of components provided on the circuit board 10 is reduced, interconnects can be more easily arranged on the circuit board 10, for example. It should be noted that a connector other than the connector illustrated in FIG. 24 or some other module (component) not having a connector may be used as the support member. The support member for the contained component may be the body (or the housing or casing) of a module, for example, or may be designed as a protrusion protruding from the body, for example, as illustrated in FIG. 24. Also, the contained component can be supported by the support member not only in an elastically engaging manner but also in various other manners such as with screws.

Although exemplary embodiments have been described so far, the present invention is not limited to the above described embodiments and modifications, and various changes may be made to them. The embodiments can be applied to components (contained components or modules) other then wireless LAN modules.

Also, appropriate changes may be made to the specific properties (such as the structures, shapes, sizes, lengths, widths, thicknesses, heights, numbers, layouts, locations, and materials) in embodying the television receivers, the electronic apparatuses, the circuit boards, the electronic components, the reinforcing plates, the reinforcing members, the contained components, the module, the first modules, the second modules, the component, the support member, the connector, the member, the connection portion, the first end portion, the second end portion, the third end portion, the first surface, the second surface, and the like.

According to the above embodiments, the efficiency in the mounting of components (modules or devices) on a circuit board can be made even higher.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a housing;
   a circuit board arranged in the housing;
   an electronic component mounted on the circuit board;
   a reinforcing plate comprising a first surface in contact with the circuit board, and a second surface located on an opposite side of the first surface and exposed to an inside of the housing;
   a component contained in the housing, the component comprising a first area located at a distance from a surface of the circuit board and a second area connected to the circuit board electrically at a position other than a third area of the circuit board, the third area being in contact with the reinforcing plate, the first area being located at the third area; and
   a support member configured to support the component, the support member comprising a first end portion fixed to the first area of the component, and a second end portion fixed to the second surface of the reinforcing plate.

2. An electronic apparatus comprising:
   a housing;
   a circuit board arranged in the housing;
   an electronic component mounted on the circuit board;
   a component contained in the housing, the component comprising a first area located at a distance from a surface of the circuit board and a second area connected to the circuit board electrically, the first area being located at a third area of the circuit board, the third area being in contact with the reinforcing plate; and
   a reinforcing plate comprising a first surface in contact with the circuit board, a second surface located on an opposite side of the first surface and exposed to an inside of the housing, and a portion protruding from the second surface and supporting the first area.

3. An electronic apparatus comprising:
   a housing;
   a circuit board arranged in the housing, the circuit board comprising a first surface and a second surface located on an opposite side of the first surface;
   a first module provided at a side of the first surface and connected to the circuit board electrically;
   a second module provided at a side of the second surface and connected to the circuit board electrically; and
   a reinforcing plate provided at the side of the second surface and provided at an opposite position of a position where the first module is located and configured to support an area of the second module, the area being other than a portion of the second module connected to the circuit board electrically, wherein
   a part of the second module is located at a specific area of the circuit board, the specific area being in contact with the reinforcing plate.

4. The electronic apparatus of claim 3, wherein the reinforcing plate is located in contact with the second surface of the circuit board.

5. An electronic apparatus comprising:
   a housing;
   a circuit board arranged in the housing, the circuit board comprising a first surface and a second surface located on an opposite side of the first surface;
   a first module provided at a side of the first surface and connected to the circuit board electrically;
   a second module provided at a side of the second surface and connected to the circuit board electrically; and
   a reinforcing member comprising, at the side of the second surface, an inner portion located at and inside a periphery of an opposite area of an area where the first module is located, and an outer portion located outside the periphery of the opposite area, a third area of the second module being supported by the reinforcing member, the third area being other than a portion of the second module, the portion being connected to the circuit board electrically, wherein
   a part of the second module is located at the opposite area.

* * * * *